United States Patent [19]
Tamura

[11] Patent Number: 6,046,613
[45] Date of Patent: Apr. 4, 2000

[54] CAPACITIVE-LOAD DRIVING CIRCUIT AND RECORDING HEAD DRIVING CIRCUIT

[75] Inventor: Noboru Tamura, Nagano, Japan

[73] Assignee: Seiko Epson Corporation, Tokyo, Japan

[21] Appl. No.: 09/168,903

[22] Filed: Oct. 9, 1998

[30] Foreign Application Priority Data

Oct. 9, 1997 [JP] Japan ................................... 9-277272
Mar. 4, 1998 [JP] Japan ................................. 10-052197

[51] Int. Cl.[7] .................................................. H03B 1/00
[52] U.S. Cl. ......................... 327/108; 327/111; 327/284
[58] Field of Search ................................... 327/108, 111, 327/112, 277, 284

[56] References Cited

U.S. PATENT DOCUMENTS

| | | | |
|---|---|---|---|
| 4,680,488 | 7/1987 | Okumura et al. ....................... | 327/111 |
| 5,537,067 | 7/1996 | Carvajal et al. ....................... | 327/112 |
| 5,729,165 | 3/1998 | Lou et al. ............................... | 327/112 |
| 5,748,019 | 5/1998 | Wong et al. ........................... | 327/112 |

*Primary Examiner*—Timothy P. Callahan
*Assistant Examiner*—An T. Luu
*Attorney, Agent, or Firm*—Sughrue, Mion, Zinn, Macpeak & Seas, PLLC

[57] ABSTRACT

An electric charge is supplied to or received from capacitors (C1, C2) when a piezoelectric element (C3) is charged or discharged by controlling transistors (Q17, Q18, Q15, Q10) which are in a first charging path (CL1) for charging from a power supply to the piezoelectric element (C3), a second charging path (CL2) for charging from the capacitors (C1, C2) to the piezoelectric element (C3), a first discharging path (DL1) for discharging from the piezoelectric element (C3) to ground (G) and a second discharging path (DL2) for discharging from the piezoelectric element (C3) to the capacitors (C1, C2), respectively.

17 Claims, 13 Drawing Sheets

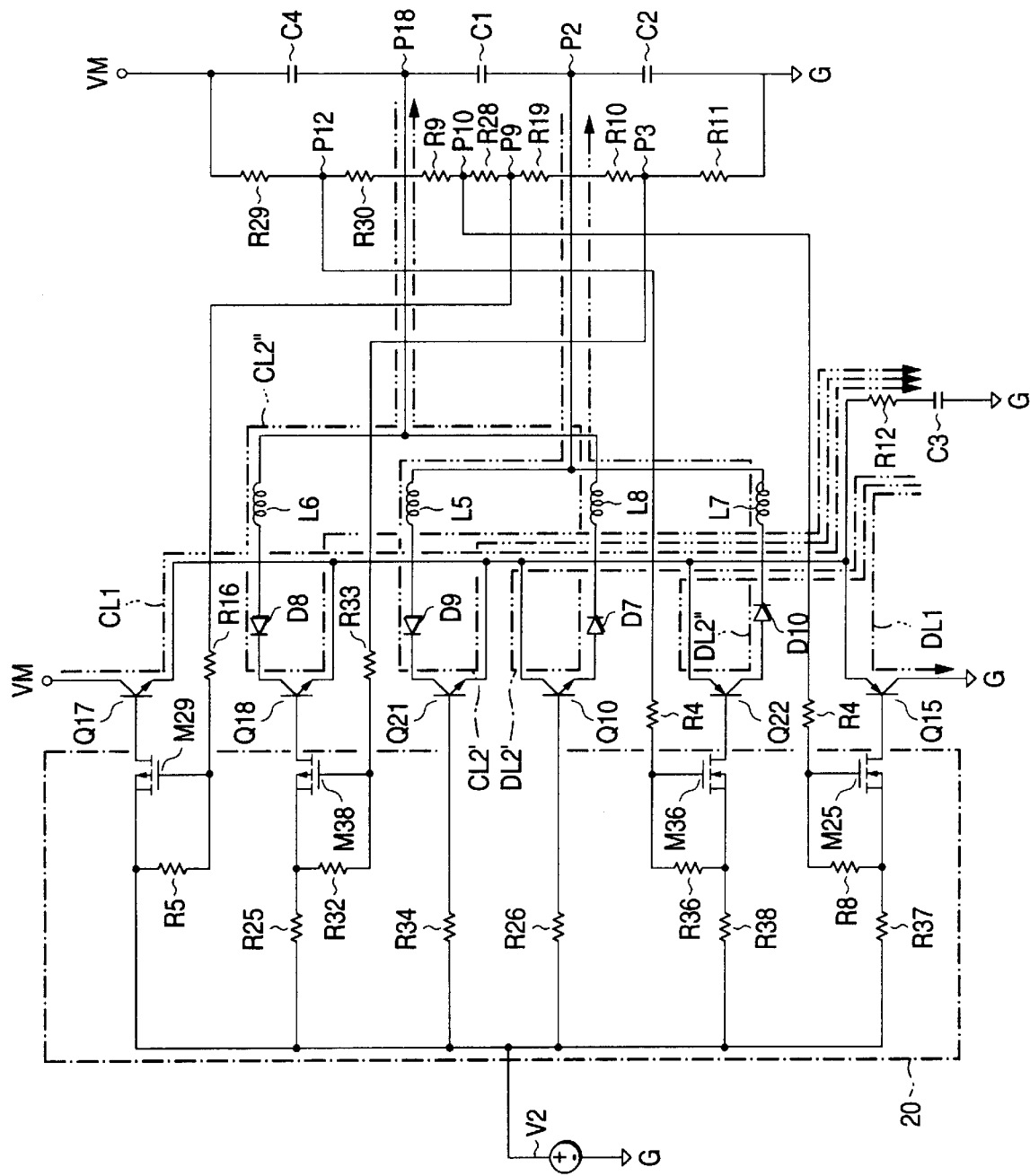
FIG. 9

CAPACITIVE-LOAD DRIVING CIRCUIT AND RECORDING HEAD DRIVING CIRCUIT

BACKGROUND OF THE INVENTION

1. Field of the Invention

This invention relates to a capacitive-load driving circuit for driving a capacitive load such as the driving circuit of an ink-jet printer head using a piezoelectric element. More particularly, the present invention relates to technology for reducing power consumption as seen from the power supply side in the driving circuit.

The present application is based on Japanese Patent Applications Nos. Hei. 9-277272 and Hei. 10-052197, the contents of which are incorporated herein by reference.

2. Description of the Related Art

In a conventional driving circuit of an ink-jet printer head using a piezoelectric element, ink is sucked and discharged by applying a trapezoidal-wavelike pulse voltage to a piezoelectric element in an ink-jet nozzle to vary the volume of an ink chamber. A push-pull current amplifier circuit using two transistors that are connected together is used in the driving circuit. In the current amplifier circuit, a capacitive load (a piezoelectric element) is charged by a power supply via one transistor, based on the trapezoidal-wavelike pulse voltage (an input signal) that is output from a trapezoidal-wave voltage generating circuit, which is formed at the preceding stage, and the charge is discharged from the capacitive load to ground via the other transistor.

However, the conventional driving circuit has several problems. One problem is high power consumption because the quantity of electricity required to charge the capacitive load is supplied totally from the power supply. Another problem is that a great deal of heat is generated by the transistors because the supply voltage is applied directly across the emitter_collector of the transistors when charging of the capacitive load is started. Still another problem is that a great deal of heat is also generated by the transistors because the peak value of the charging voltage is applied directly across the emitter_collector of the transistors even when discharging of the capacitive load is started.

SUMMARY OF THE INVENTION

In view of the foregoing problems, an object of the present invention is to provide a capacitive-load driving circuit capable of reducing power consumption, as seen from a power supply, by making use of a load which is capacitive, and reducing heat generated by switching elements, and a recording head driving circuit.

In order to solve the problems described above, according to the present invention, a capacitive-load driving circuit for repeatedly charging and discharging a capacitive load based on an input signal comprises: a first switching element in a first charging path for use in electrical charging from a power supply to the capacitive load; a second switching element in a second charging path for use in electrical charging from capacitors to the capacitive load; a third switching element in a first discharging path for use in electrical discharging from the capacitive load to ground; a fourth switching element in a second discharging path for use in electrical discharging from the capacitive load to the capacitors; and a control circuit for holding the third and fourth switching elements "off" when charging the capacitive load and sequentially switching the second switching element and then the first switching element "on" and for holding the first and second switching elements "off" when discharging the capacitive load and sequentially switching the fourth switching element and then the third switching element "on."

According to the present invention, a part of the charge discharged from the capacitive load, such as a piezoelectric element, is stored in the capacitors and is used for charging the capacitive load, thus, the capacitive load is not charged totally by the power supply. In other words, part of the charge necessary for charging the capacitive load is supplied from the capacitors and the rest of the charge is supplied from the power supply. Hence, power consumption as seen from the power supply is low. Moreover, as seen from the switching element, the power supply voltage is not applied directly. Hence, less heat is generated from the switching element. Another advantage is that a small package can be used because the generation of heat by each switching element is reduced to the extent of an increase in the number of switching elements.

According to the present invention, the capacitive-load driving circuit may have a second charging path with the second switching element which is in a line independent of the first charging path, and a second discharging path with the fourth switching element which is in a line independent of the first discharging path.

When an independent second charging path and the second discharging path are used, paths similar in basic configuration to each other may be arranged in a plurality of lines. In this case, the control circuit sequentially switches the second switching elements, which are each put in the plurality of second charging paths, "on", from low voltage use to high voltage use, when charging the capacitive load, and sequentially switches the second switching elements, which are each put in the plurality of second discharging paths, "on", from high voltage use to low voltage use, discharging the capacitive load. As a result of the configuration described above, power consumption, as seen from the power supply, can be reduced since an exchange of the charge between the capacitive load and the capacitors is increased.

According to the present invention, a second charging path with the second switching element may be formed in a line common to the first charging path so that the second switching element and the first switching element are connected in series and a second discharging path with the fourth switching element may be formed in the line common to the first discharging path so that the fourth switching element and the third switching element are connected in series. In this case, the control circuit switches the first switching element "on" while holding the second switching element "on" after switching the second switching element "on" when charging the capacitive load, and switches the third switching element "on" while holding the fourth switching element "on" after switching the fourth switching element "on" when discharging the capacitive load.

According to the present invention, a second charging path for low voltage use may be formed as the second charging path with the second switching element in a line common to the first charging path so that the second switching element and the first switching element are connected in series with a second charging path for high voltage use with the second switching element in a line independent of the first charging path, and a second discharging path for low voltage use may be formed as the second discharging path with the fourth switching element in the line common to the first discharging path so that the fourth switching element and the third switching element are connected in series and a second discharging path for high voltage use with the fourth switching element in the line independent of the first discharging path.

In this case, the control circuit sequentially switches the second switching element and the first switching element of the second charging path for high voltage use "on" while holding the second switching element "on" after switching the second switching element of the second charging path for low voltage "on" when charging the capacitive load, and sequentially switches the fourth switching element and the third switching element of the second discharging path for high voltage use "on" while holding the fourth switching element "on" after switching the fourth switching element of the second discharging path for low voltage "on" when discharging the capacitive load. Thus, power consumption, as seen from the power supply, can be reduced to the extent that an exchange of the charge between the capacitive load and the capacitors is increased.

According to the present invention, the control circuit controls the on-off operations of the first, second, third and fourth switching elements based on, for example, the relative difference in level between the potential of the input signal and the terminal potential of the capacitors. For example, the control circuit has a differential amplifier circuit for comparing the relative level of the potential of the input signal with that of the terminal potential of the capacitors and controls the on-off operations of the first, second, third and fourth switching elements based on the output of the differential amplifier circuit. Moreover, the control circuit has a voltage comparator for comparing the relative level of the potential of the input signal with that of the terminal potential of the capacitors and controls the on-off state of one of the first, second, third and fourth switching elements based on the output of the voltage comparator.

According to the present invention, it is preferable to put an inductor in both the second charging path and the second discharging path. With this arrangement, the voltage applied to the second and fourth switching elements is kept low by using the counter electromotive force of the inductors. Therefore, the quantity of heat generated from the second and fourth switching elements is reduced. Moreover, the "on" time of the second and fourth switching elements is prolonged due to the counter electromotive force of the inductors. Therefore, the charge stored in the capacitors is used effectively. As a result, the load of the power supply is also reduced.

According to the present invention, it is also preferable to put a diode in the second charging path for cutting off reverse current from the capacitive load to the capacitors and to put a diode in the second discharging path for cutting off reverse current from the capacitors to the capacitive load.

According to the present invention, the control circuit may include a first MOSFET connected to the control terminal of the second switching element and a second MOSFET connected to the control terminal of the fourth switching element. In this case, it is preferable that the control circuit have Zener diodes, each connected across the gate_source of the first MOSFET, and across the gate_source of the second MOSFET in order to limit the voltage applied across the gate_source of the first MOSFET and that of the second MOSFET.

A recording head driving circuit may use the capacitive-load driving circuit with the piezoelectric element as a capacitive load in an ink-jet nozzle and the control circuit for controlling the on-off operations of the first, second, third and forth switching elements with a trapezoidal-wavelike pulse voltage that is output from a trapezoidal-wave voltage generating circuit as an input signal.

BRIEF DESCRIPTION OF THE DRAWINGS

FIG. 9 shows a recording head driving circuit diagram in Embodiment 4 according to the present invention;

DETAILED DESCRIPTION OF THE PREFERRED EMBODIMENTS

[Embodiment 1]

Figure 1:
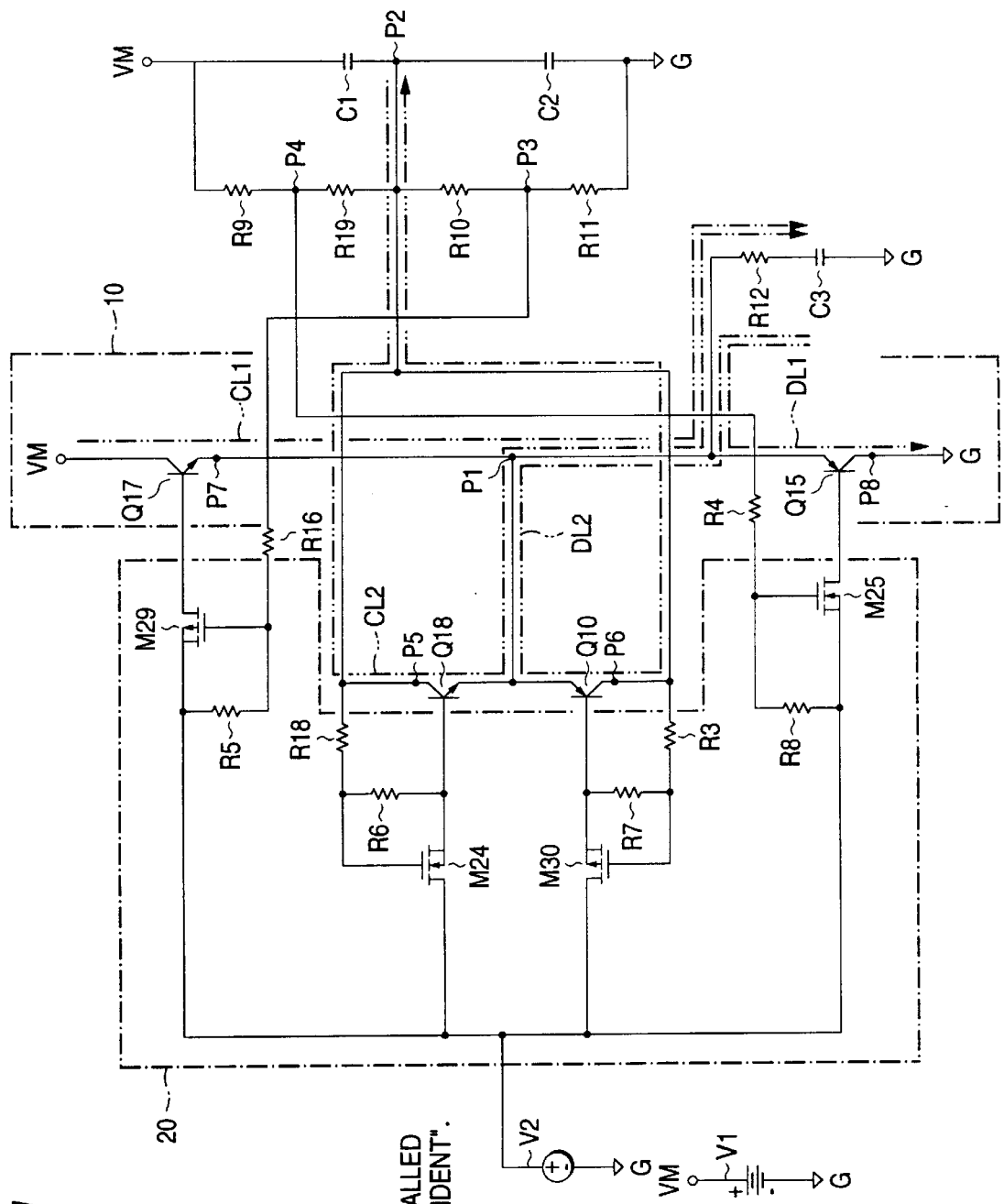
FIG. 1 shows a recording head driving circuit diagram in Embodiment 1 according to the present invention.

FIG. 1 is a diagram of the recording head driving circuit of Embodiment 1 that is used for driving a piezoelectric element (a capacitive load) in an ink-jet nozzle of an ink-jet printer. The description of the configuration and operation of a driving pulse trapezoidal-wave voltage generating circuit in the driving circuit will be omitted because any of the well known circuits may be used.

As shown in FIG. 1, a trapezoidal-wavelike pulse voltage (an input signal V2) that is output from a trapezoidal-wave voltage generating circuit (not shown) formed at the preceding stage in the driving circuit of the ink-jet printer is subjected to current amplification before being applied to a piezoelectric element C3 to cause variation in the volume of an ink chamber so that ink is sucked and discharged. Since the piezoelectric element is a capacitive load, the driving circuit shown in FIG. 1 is equivalent to a capacitive-load driving circuit.

A push-pull current amplifier circuit 10, with two transistors Q17 and Q15 connected together, is disposed in the driving circuit in Embodiment 1. A piezoelectric element C3, as a capacitive load having a capacitance value of 1 μF, is inserted between a point P1, between transistors Q17 and Q15, and ground G. This driving circuit and any conventional driving circuit have the following in common: current amplifier circuit 10 is controlled according input signal V2 from the trapezoidal wave voltage generating circuit; a first charging path CL1 is used for charging piezoelectric element C3 via transistor Q17 and a resistor R12; and a first discharging path DL1 is used for discharging the charge from piezoelectric element C3 to ground G via resistor R12 and transistor Q15. Resistor R12 has an extremely low resistance value of about 0.15 ohms.

Transistor Q17, as a first switching element according to the present invention, is included in first charging path CL1 and when piezoelectric element C3 is charged, provides or stops the supply of charging current from a power supply (power supply potential VM) to piezoelectric element C3 as will be more fully discussed below. Transistor Q15 as a third switching element according to the present invention is included in first discharging path DL1 and when piezoelectric element C3 is discharged, provides or stops the supply of discharged current from piezoelectric element C3 to ground G as will be more fully discussed below.

In addition to the current amplifier circuit like this, a second charging path CL2 is formed for use in charging piezoelectric element C3 by capacitors C1 and C2 prior to charging piezoelectric element C3 via first charging path CL1. Second charging path CL2 is connected to a point P2, between capacitors C1 and C2 connected in series, between the power supply and ground G. Furthermore, divider resistors R9, R19, R10 and R11 and capacitors C1 and C2 are connected in parallel. Capacitors C1 and C2 each have a capacitance sufficiently greater than that of the load (piezoelectric element C3), the value of which is equal to, for example, about 10 μF (about 10 times greater than the capacitance value of piezoelectric element C3 as a load).

A transistor Q18 (a second switching element according to the present invention) is included in second charging path CL2 and keeps second charging path CL2 closed only during the time piezoelectric element C3 is charged from P2, between capacitors C1 and C2, via second charging path CL2, and switches second charging path CL2 open during all other times. At this point, transistor Q18 is in a line independent of first charging path CL1 out of second charging path CL2.

A second discharging path DL2 is formed in the driving circuit in Embodiment 1 for use in charging capacitors C1 and C2 with the charge discharged from piezoelectric element C3, prior to discharging piezoelectric element C3 via first discharging path DL1.

A transistor Q10 (a fourth switching element according to the present invention) is included in second discharging path DL2 and keeps second discharging path DL2 closed only during the time piezoelectric element C3 is discharged to capacitors C1 and C2 via second discharging path DL2, and switches second charging path CL2 open during all other times. At this point, transistor Q10 is included in the line independent of first discharging path DL1 out of second discharging path DL2.

In order to charge or discharge piezoelectric element C3 by selecting first and second charging paths CL1 and CL2 or first and second discharging paths DL1 and DL2 thus arranged, a control circuit 20 is formed for holding transistors Q15 and Q10 "off" when piezoelectric element C3 is charged and sequentially switching transistors Q18 and then Q17 "on" and for holding transistors Q18 and Q17 "off" when piezoelectric element C3 is discharged and sequentially switching transistors Q10 and then Q15 "on".

Resistors R5 and R16 and MOSFET M29 are included in control circuit 20 so that when the potential of input signal V2 reaches a predetermined level or above, during the time input signal V2 rises, piezoelectric element C3 is charged via first charging path CL1 by turning on transistor Q17. The potential at a point P3, between resistors R10 and R11, as divider resistors with respect to capacitor C2, is used as a comparative potential corresponding to input signal V2 to perform this switching operation. At this point, the resistance values of the resistors R10 and R11 are 10 kΩ and 7 kΩ, respectively, and the result of dividing input signal V2 by resistors R5 and R16 is supplied to the gate of MOSFET M29.

Resistors R4 and R8 and MOSFET M25 are included in control circuit 20 so that when the potential of input signal V2 drops to a predetermined level or below, during the time input signal V2 falls, piezoelectric element C3 is discharged via first discharging path DL1 by turning on transistor Q15. The potential at a point P4 between resistors R9 and R19, as divider resistors with respect to the capacitor C1, is used as a comparative potential corresponding to input signal V2 to perform this switching operation. At this point, the resistance values of resistors R9 and R19 are 12 kΩ and 10 kΩ, respectively, and the result of dividing input signal V2 by resistors R8 and R4 is supplied to the gate of MOSFET M25.

MOSFET M24 is included in control circuit 20 for supplying input signal V2 to the base of transistor Q18 and the potential at P2 between capacitors C1 and C2 is input to gate of MOSFET M24 via a resistor R18. At this point, the resistance values of resistors R9 and R19 are 12 kΩ and 10 kΩ, respectively, whereas those of resistors R10 and R11 are 10 kΩ and 7 kΩ, respectively, and a potential slightly lower than the means value of power supply voltage VM is supplied to the gate of MOSFET 24. In this case, a resistor R6 is connected between the source gate of MOSFET 24.

MOSFET M30 is included in control circuit 20 for supplying input signal V2 to the base of transistor Q10 and the potential at P2 between capacitors C1 and C2 is input to the gate of MOSFET M30 via a resistor R3. At this point, the resistance values of resistors R9 and R19 are 12 kΩ and 10 kΩ, respectively, whereas those of resistors R10 and R11 are 10 kΩ and 7 kΩ, respectively, and the potential slightly lower than the means value of power supply voltage VM is supplied to the gate of MOSFET M30. In this case, a resistor R7 is connected between the source_gate of MOSFET M30.

FIGS. 2(A), (B) and (C) show the potential variation of input signal V2 and the potential and current variations at each point in the driving circuit. The variations shown in FIG. 2(B) are of the terminal potential of piezoelectric element C3, the potential at P2, between capacitors C1 and C2, the potential at a point P5 on the collector side of transistor Q18 and the potential at a point P6 on collector side of the transistor Q10, respectively. The variations shown in FIG. 2(C) refer to the current variation detected at P5 on the collector side of transistor Q18, the current variation detected at a point P7 on the emitter side of transistor Q17, the current variation detected at P6 on the collector side of transistor Q10 and the current variation detected at a point P8 on the collector side of transistor Q17.

As shown in FIG. 2(A), input signal V2 is in the form of a trapezoidal-wavelike voltage pulse including a linear rise time (time interval between time T1 and time T3), a flat peak level time (time interval between time T3 and time T4) and a linear decay time (time interval between time T4 and time T6), input signal V2 being reduced to a trapezoidal wavelike voltage pulse (a head-driving voltage pulse) that has been subjected to current amplification via current amplifier circuit 10.

First, capacitors C1 and C2 are in a charged state and piezoelectric element C3 is in a discharged state at time T1. At this point, MOSFET M24 is held "on", as its gate potential is high, and input signal V2 is applied to the base of transistor Q18 via MOSFET M24. At this initial stage, the base potential of transistor Q18 is lower than the potential (the collector potential of transistor Q18) at P2, between capacitors C1 and C2 as the potential of input signal V2 is still low. The charging current, as shown in FIG. 2(C), from capacitors C1 and C2 flows into piezoelectric element C3 after it is passes through transistor Q18 in second charging path CL2 since the potential (the emitter potential of transistor Q18) is lower than the base potential and the collector potential of transistor Q18 immediately after the charging of piezoelectric element C3 is started. In the meantime, MOSFET M29 is held "off" as its gate potential is high and transistor Q17 is held "off." Consequently, no charging from the power supply via first charging path CL1 to piezoelectric element C3 occurs.

Piezoelectric element C3 is thus continuously charged at time T2 until the potential of piezoelectric element C3 (the emitter potential of transistor Q18) becomes substantially equal to the collector potential of transistor Q18. When the potential of input signal V2 becomes higher, as the charging of piezoelectric element C3 continues, MOSFET M24 is turned off, whereas MOSFET M29 is turned on. Therefore, transistor Q18 is held "off," so that second charging path CL2 is opened. On the other hand, transistor Q17 is held "on" and charging from the power supply via first charging path CL1 to piezoelectric element C3 starts.

Then the potential of piezoelectric element C3 becomes equal to the highest potential of the trapezoidal wave at time T3. While piezoelectric element C3 is being charged, transistors Q10 and Q15 are held "off."

When input signal V2 falls at time T4 after the state described above, discharging of piezoelectric element C3 is started. At this time, MOSFET M30 is held "on", as its gate potential is low, and input signal V2 is applied via MOSFET M30 to the base of transistor Q10. Since the potential of input signal V2 is still high at this initial stage, the base potential of transistor Q10 is higher than the potential at P2 between capacitors C1 and C2 (the collector potential of transistor Q10). As the potential (the emitter potential of transistor Q10) is higher than the base and collector potential of transistor Q10 immediately after discharging of piezoelectric element C3 is started, the current as shown in FIG. 2(C) discharged from piezoelectric element C3 flows into and is stored in capacitors C1 and C2, after it is passed through transistor Q10 in second discharging path DL2. In the meantime, MOSFET M25 is held "off" as its gate potential is low and transistor Q15 is held "off." Consequently, no discharging from piezoelectric element C3 via first discharging path DL1 to ground G occurs.

Piezoelectric element C3 is thus discharged at time T5 until the potential of piezoelectric element C3 (the emitter potential of transistor Q10) becomes substantially equal to the collector potential of transistor Q10. When the potential of input signal V2 becomes lower, as discharging of piezoelectric element C3 continues, MOSFET M30 is turned off, whereas MOSFET M25 is turned on. As a result, transistor Q10 is held "off," so that second discharging path DL2 is opened. On the other hand, transistor Q15 is held "on" and discharging from piezoelectric element C3 via first discharging path DL1 to ground G starts.

Then the potential of piezoelectric element C3 becomes equal to the lowest potential of the trapezoidal wave at time T6. While piezoelectric element C3 is being discharged, transistors Q18 and Q17 are held "off."

In the driving circuit in Embodiment 1, part of the charge is stored in capacitors C1 and C2 instead of completely discharging piezoelectric element C3 to ground G as in the conventional circuit. Moreover, piezoelectric element C3 is not charged totally by the power supply, rather the charge stored in capacitors C1 and C2 is also used for charging piezoelectric element C3. Hence, part of the quantity of electricity necessary for charging piezoelectric element C3 is supplied from capacitors C1 and C2 and the rest of the power is supplied from the power supply. Consequently, power consumption is low as seen from the power supply. As seen from transistor Q17, power supply voltage VM is not applied directly across the emitter collector rather only the voltage equivalent to the difference between the terminal potential of piezoelectric element C3, after charging piezoelectric element C3 is carried out by capacitors C1 and C2, and the power supply potential, is applied. Hence, less heat is generated by transistor Q17.

This is also the case with transistor Q15 because power supply voltage VM is not applied directly across the emitter collector rather only the voltage equivalent to the difference between the terminal potential of piezoelectric element C3, after discharging piezoelectric element C3 to capacitors C1 and C2 is carried out, and the potential of the ground G, is applied. Hence, less heat is generated by transistor Q15. Therefore, an advantage of this circuit is that a small package can be used because the generation of heat by each switching element is reduced to the extent of an increase in the number of switching elements.

[Modified Example 1 of Embodiment 1]

Figure 3:
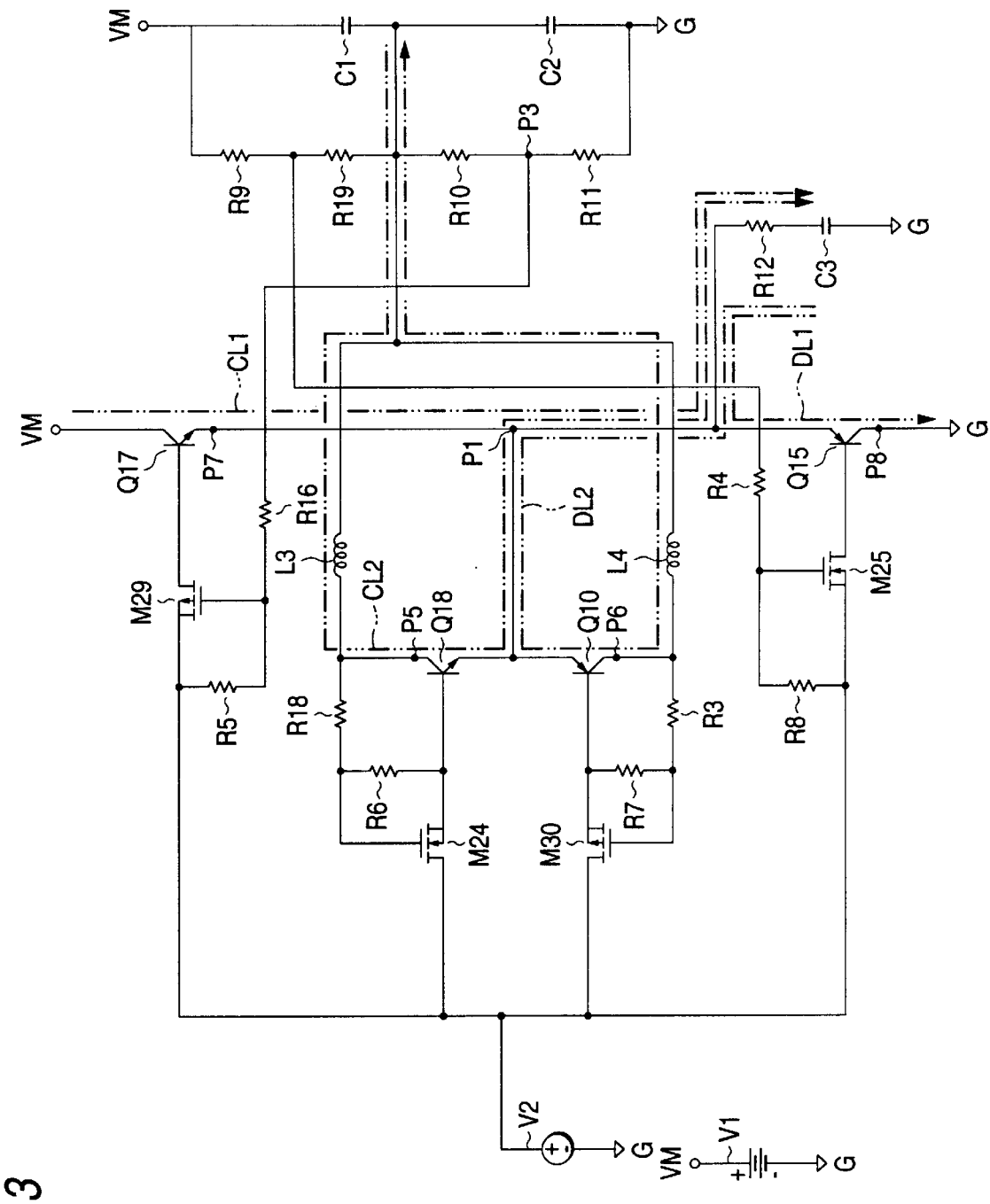
FIG. 3 shows a recording head driving circuit diagram in Modified Example 1 of Embodiment 1 according to the present invention.

FIG. 3 is a diagram of the recording head driving circuit (a capacitive load driving circuit) of a Modified Example 1 of Embodiment 1 above described. The basic configuration of the driving circuit in this example is similar to that of the driving circuit in Embodiment 1. As shown in FIG. 3, an inductor L3 has been added in between the collector of transistor Q18 and P2, between capacitors C1 and C2, in second charging path CL2, and an inductor L4 has been added in between the collector of transistor Q10 and P2, between capacitors C1 and C2, in second discharging path DL2. Because the rest of the configuration is similar to that in Embodiment 1 described above, the description thereof will be omitted.

Figure 4:
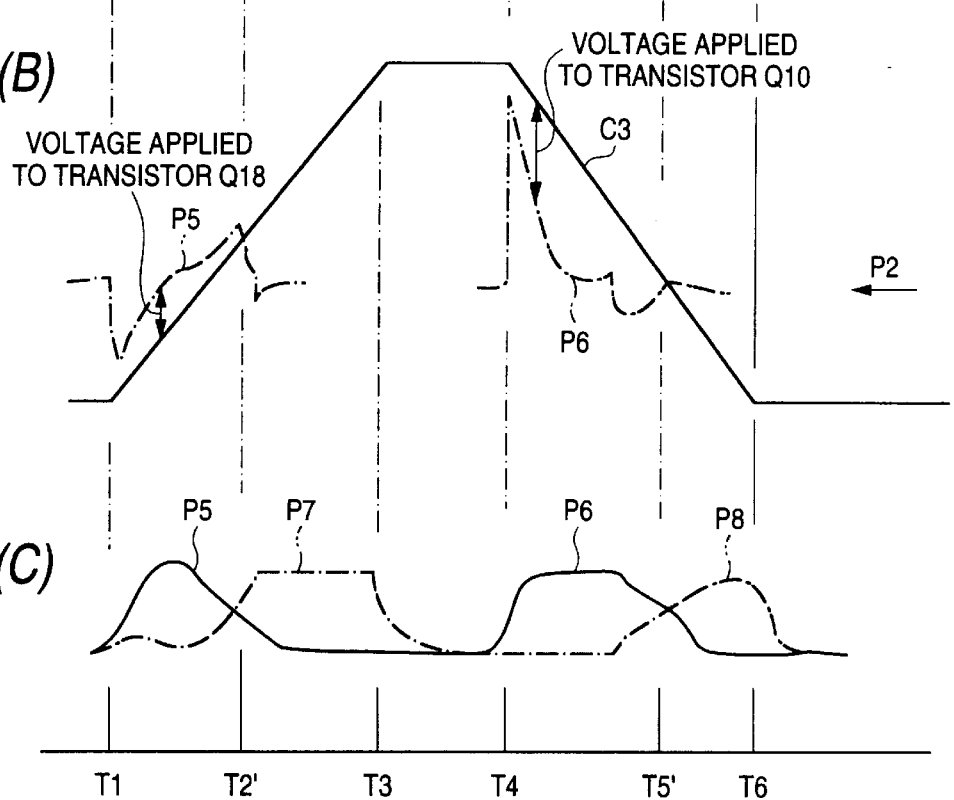
FIG. 4(A) shows a waveform chart of an input signal to a recording head driving circuit of FIG. 3.
FIG. 4(B) shows a waveform chart illustrating potential variation at each point of the recording head driving circuit therein.
FIG. 4(C) shows a waveform chart illustrating current variation at each point of the recording head driving circuit therein.

FIGS. 4(A), (B) and (C) show the potential variation of input signal V2 and the potential and current variations at each point in the driving circuit. The variations shown in FIG. 4(B) are, as in the case of FIG. 2(B), of the terminal potential of piezoelectric element C3, the potential at P2, between capacitors C1 and C2, the potential at P5 on the collector side of transistor Q18 and the potential at P6 on the collector side of transistor Q10, respectively. The variations shown in FIG. 4(C) refer to, as in the case of FIG. 2(C), the current variation detected at P5 on the collector side of transistor Q18, the current variation detected at P7 on the emitter side of transistor Q17, the current variation detected at P6 on the collector side of transistor Q10 and the current variation detected at P8 on the collector side of transistor Q17.

As shown in FIGS. 4(A)–4(C), MOSFET M24 is held "on" as its gate potential is high and input signal V2 is applied to the base of transistor Q18 via MOSFET 24. At this initial stage, the base potential of transistor Q18 is lower than the potential collector potential of transistor Q18 at P2, between capacitors C1 and C2, as the potential of input signal V2 is still low.

The charging current, as shown in FIG. 4(C) from capacitors C1 and C2 flows into piezoelectric element C3 after it passes through transistor Q18 in second charging path CL2 since the potential (the emitter potential of transistor Q18) is lower than the base potential and the collector potential of transistor Q18 immediately after the charging of piezoelectric element C3 starts. Consequently, the potential at P5 on the collector side of transistor Q18 temporarily falls and then rises, as shown in FIG. 4(B), due to the counter electromotive force of inductor L3. At this time, the quantity of heat generated by transistor Q18 is less than that in the case of FIG. 2(B) because the voltage applied to transistor Q18 is low. In the meantime, MOSFET M29 is held "off", as its gate potential is high, and transistor Q17 is held "off." Hence, no charging from the power supply via first charging path CL1 to piezoelectric element C3 occurs.

Piezoelectric element C3 is thus continuously charged at time T2' until the potential of piezoelectric element C3 (the emitter potential of the transistor Q18) becomes substantially equal to the collector potential of transistor Q18. When the potential of input signal V2 becomes higher, as charging of piezoelectric element C3 continues, MOSFET M24 is turned off, whereas MOSFET M29 is turned on. Consequently, transistor Q18 is held "off," so that second charging path CL2 is opened. On the other hand, transistor Q17 is held "on" and charging from the power supply via first charging path CL1 to piezoelectric element C3 starts. Since the potential at P5 on the collector side of transistor Q18 temporarily falls and then rises, as shown in FIG. 4(B), due to the counter motive force of inductor L3 at this point, a time interval between time T1 and time T2' becomes longer than the time interval between time T1 and time T2 as in the case of FIG. 2(B). In other words, the charge stored in capacitors C1 and C2 can be used effectively for charging piezoelectric element C3 as the "on" time of the transistor Q18 is long.

Then, at time T3, the potential of piezoelectric element C3 becomes equal to the highest potential of the trapezoidal wave. While piezoelectric element C3 is being charged, transistors Q10 and Q15 are held "off."

When input signal V2 falls at time T4 after the state above described, discharging of piezoelectric element C3 starts. At this time, MOSFET M30 is held "on", as its gate potential is low, and input signal V2 is applied to the base of transistor Q10 via MOSFET M30. Since the potential of input signal V2 is still high at this initial stage, the base potential of transistor Q10 is higher than the potential (the collector potential of transistor Q10) at P2, between capacitors C1 and C2.

As the potential (the emitter potential of transistor Q10) is higher than the base and collector potential of transistor Q10 immediately after discharging of piezoelectric element C3 starts, the current as shown in FIG. 4(C), discharged from piezoelectric element C3 flows into and is stored in capacitors C1 and C2 after it is passed through transistor Q10 in second discharging path DL2. At this time, the potential at P6 on the collector side of transistor Q10 temporarily rises and then falls, as shown in FIG. 4(B), due to the counter electromotive force of inductor L4. Consequently, the quantity of heat generated by transistor Q10 is less than that as in the case of FIG. 2(B) because the voltage applied to transistor Q10 is low. In the meantime, MOSFET 25 is held "off", as its gate potential is low, and transistor Q15 is held "off." Hence, no discharging from piezoelectric element C3 via first discharging path DL1 to ground G occurs.

Piezoelectric element C3 is thus discharged at time T5' until the potential of piezoelectric element C3 (the emitter potential of transistor Q10) becomes substantially equal to the collector potential of transistor Q10. When the potential of the input signal V2 becomes lower, as discharging of piezoelectric element C3 continues, MOSFET M30 is turned off, whereas MOSFET M25 is turned on. As a result, transistor Q10 is held "off," so that second discharging path DL2 is opened. On the other hand, transistor Q15 is held "on" and discharging of piezoelectric element C3 via first discharging path DL1 to ground G starts. Since the potential at P6 on the collector side of transistor Q10 temporarily rises and then falls, as shown in FIG. 4(B), due to the counter motive force of inductor L4 at this point, a time interval between time T4 and time T5' becomes longer than the time interval between time T4 and time T5 as in the case of FIG. 2(B). In other words, the charge can be stored effectively in capacitors C1 and C2 as the "on" time of transistor Q10 is long.

Then, at time T6, the potential of piezoelectric element C3 becomes equal to the lowest potential of the trapezoidal wave. While piezoelectric element C3 is being discharged, transistors Q18 and Q17 are held "off."

Therefore, part of the quantity of electricity necessary for charging piezoelectric element C3 is supplied from capacitors C1 and C2 and the rest of the power is supplied from the power supply. Consequently, similarly to Embodiment 1 power consumption is low as seen from the power supply.

Also, in this modified example, the voltage applied to transistors Q10 and Q18 is held low and their "on" time is prolonged by using the counter electromotive force of inductors L3 and L4. This is advantageous because, not only is the quantity of heat generated by transistors Q10 and Q18 reduced, but also the load of the power supply is small since the charge stored in capacitors C1 and C2 is used effectively.

[Modified Example 2 of Embodiment 1]

Figure 5:
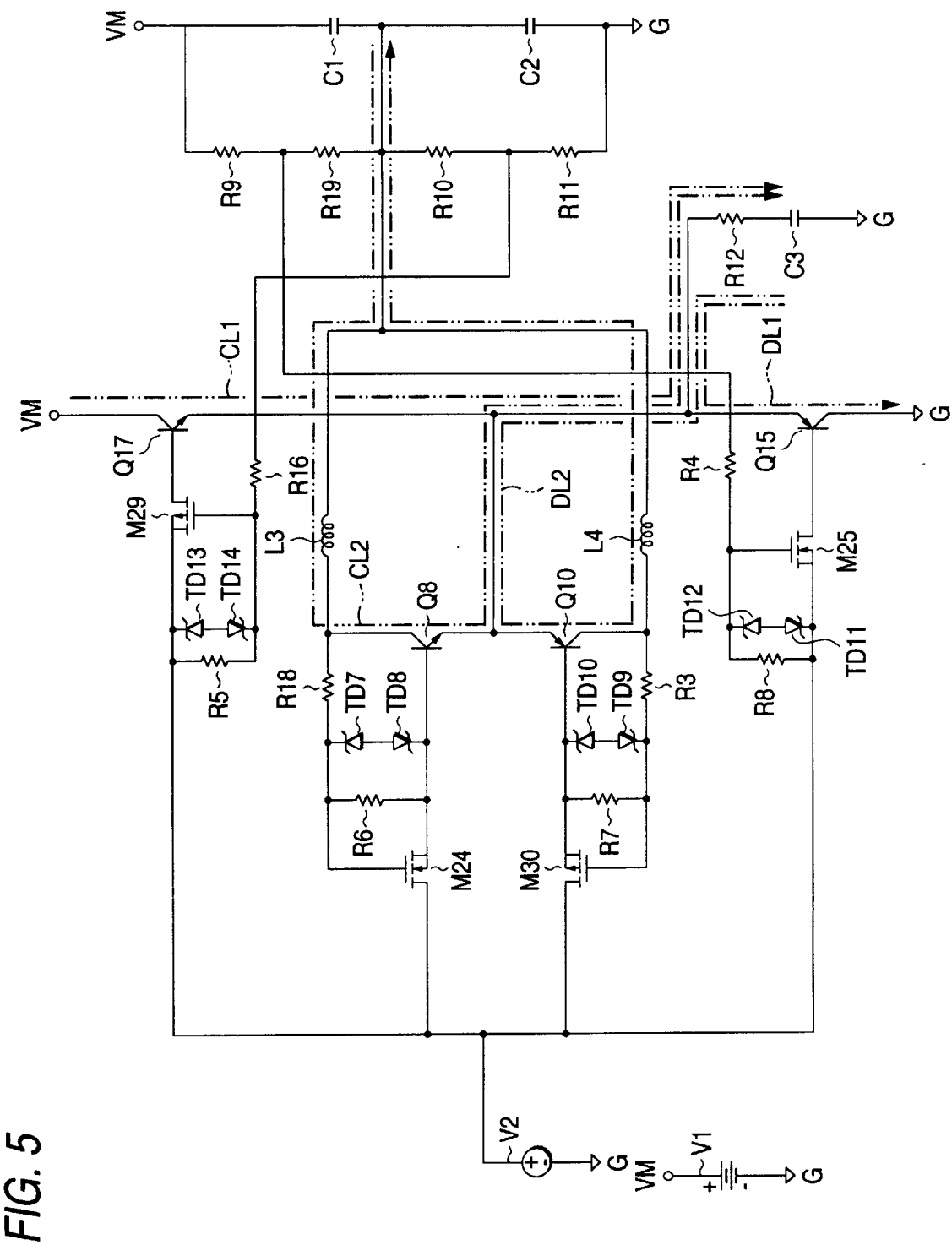
FIG. 5 shows a recording head driving circuit diagram in Modified Example 2 of Embodiment 1 according to the present invention.

FIG. 5 is a diagram of the recording head driving circuit (a capacitive load driving circuit) of a modified example 2 of Embodiment 1 described above. The basic configuration of the driving circuit in this example is similar to that of the driving circuit in Modified Example 1 of Embodiment 1.

As is shown in FIG. 5, inductor L3 is included in between the collector of transistor Q18 and P2, between capacitors C1 and C2, in second charging path CL2, and inductor L4 is included in between the collector of transistor Q10 and P2, between capacitors C1 and C2, in second discharging path DL2 as in Modified Example 1 of Embodiment 1.

Zener diodes TD7 and TD8 are connected in parallel to resistor R6 across the gate_source of MOSFET M24 in this example. Zener diodes TD7 and TD8 are also connected in parallel to resistor R7 across the gate_source of MOSFET M30. Furthermore, Zener diodes TD13, TD14, TD11 and TD12 are connected in parallel to resistors R5 and R8 across the gate_source of both MOSFETs M29 and M25. In this case, each of Zener diodes TD7, TD8, TD9, TD10, TD13, TD14, TD11 and TD12 has a play-down voltage of 15 V in order to limit the gate_source voltage of MOSFETs M24, M30, M29 and M25. Accordingly, MOSFETs M24, M30, M29 and M25 are prevented from being destroyed because the voltage applied across the gate_source of each of MOSFETs M24, M30, M29 and M25 never exceeds the rated voltage.

[Embodiment 2]

Figure 6:
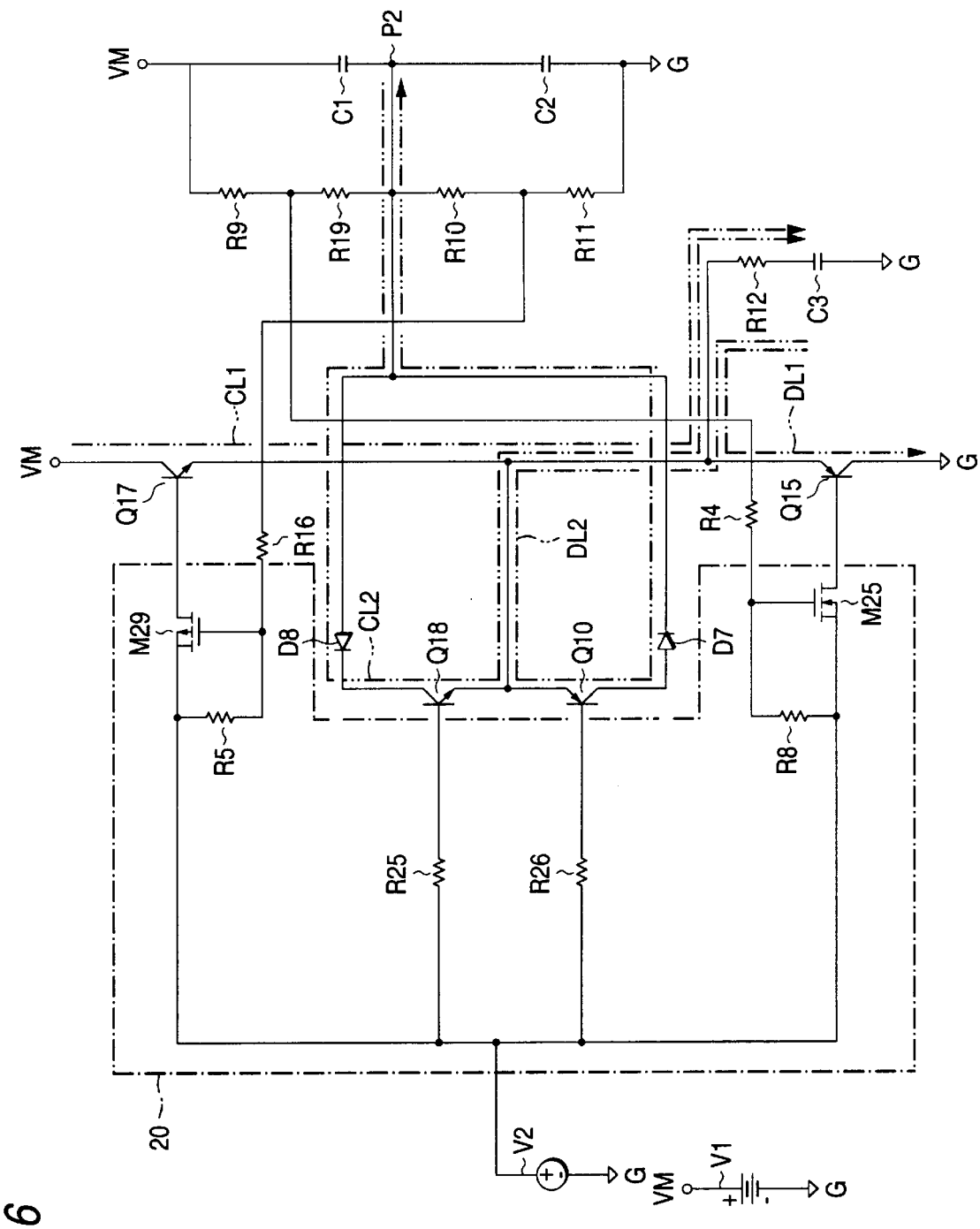
FIG. 6 shows a recording head driving circuit diagram in Embodiment 2 according to the present invention.

FIG. 6 is a diagram of the recording head driving circuit (a capacitive-load driving circuit) of the second Embodiment. The basic configuration of the driving circuit in this example is also similar to that of the driving circuit in Embodiment 1, except for part of its control circuit configuration. Like elements having corresponding functions are given like reference characters in FIG. 6 and the description thereof will be omitted.

Although control circuit 20 has been used for controlling transistors Q18 and Q10 by controlling their base voltage with MOSFETs in Embodiment 1 (see FIG. 1), in Embodiment 2, control circuit 20 supplies input signal V2 to the bases of transistors Q18 and Q10, via resistors R25 and R26, as shown in FIG. 6. Furthermore, a diode D8 has been added in between the collector of transistor Q18 and P2, between the capacitors C1 and C2, in second charging path CL2 in order to cut off inverse current from input signal V2 after the potential of input signal V2 becomes higher than the potential of P2. A diode D7 has also been added in between the collector of transistor Q10 and P2, between capacitors C1 and C2, in second discharging path DL2 in order to cut off the inverse current from input signal V2 after the potential of input signal V2 turns lower than that of P2.

Figure 2:
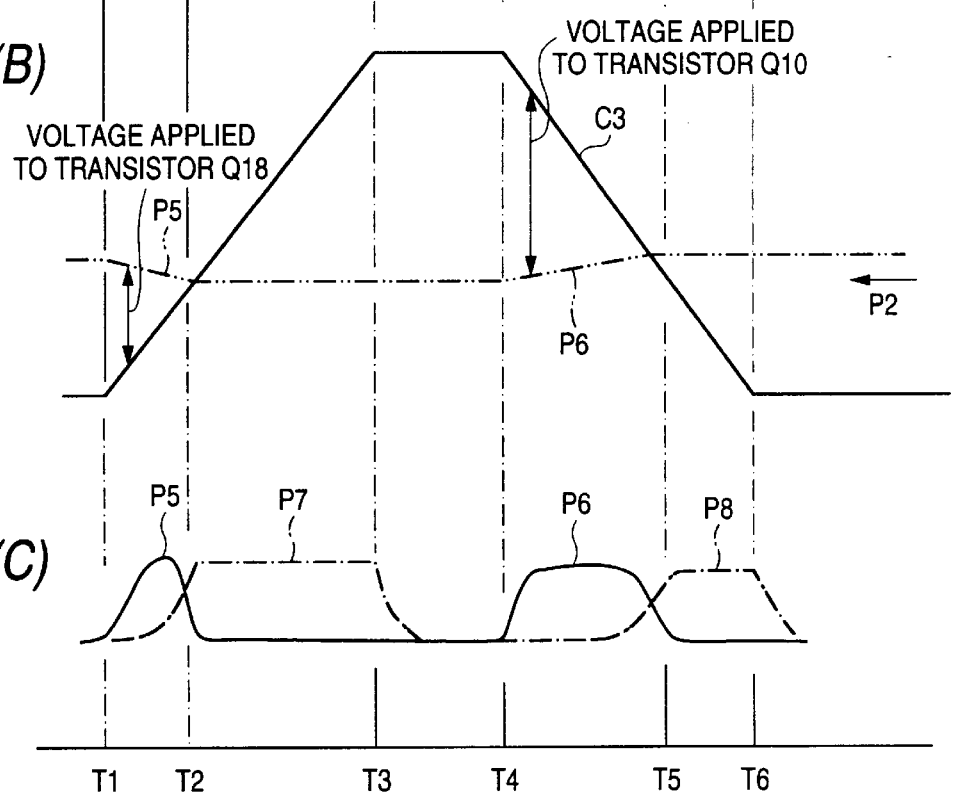
FIG. 2(A) shows a waveform chart of an input signal to the recording head driving circuit of FIG. 1.
FIG. 2(B) shows a waveform chart illustrating potential variation at each point of the recording head driving circuit therein.
FIG. 2(C) shows a waveform chart illustrating current variation at each point of the recording head driving circuit therein.

With the arrangement above, charging piezoelectric element C3 by capacitors C1 and C2 via second charging path CL2 occurs since the potential (the emitter potential of transistor Q18) is lower than the collector potential of transistor Q18 immediately after charging piezoelectric element C3 is started during a time interval corresponding to, and between, time T1 and time T2 in FIG. 2. On the other hand, the current never flows from input signal V2 into capacitors C1 and C2 via the base and collector of transistor Q18 since diode D8 has been added in second charging path CL2 even when the potential (the emitter potential of the transistor Q18) of piezoelectric element C3 becomes higher than the collector potential of transistor Q18 at time T2 and thereafter, or otherwise, even after charging of piezoelectric element C3 from the power supply via first charging path CL1 starts with transistor Q17 held "on."

Furthermore, discharging of piezoelectric element C3 via second charging path CL2 to capacitors C1 and C2 occurs since the potential (the emitter potential of transistor Q10) is higher than the collector potential of transistor Q10 immediately after charging of piezoelectric element C3 starts during a time interval corresponding to and between time T4 and time T5 in FIG. 2. On the other hand, the current never flows from capacitors C1 and C2 via the base and collector of transistor Q10 toward input signal V2 since diode D7 has been added in second discharging path DL2 even when the potential (the emitter potential of transistor Q10) of piezoelectric element C3 becomes lower than the collector potential of transistor Q10 at time T5 and thereafter, or otherwise, even after discharging of piezoelectric element C3 to ground G, via first discharging path DL1, starts with transistor Q15 held "on."

[Modified Example of Embodiment 2]

Figure 7:
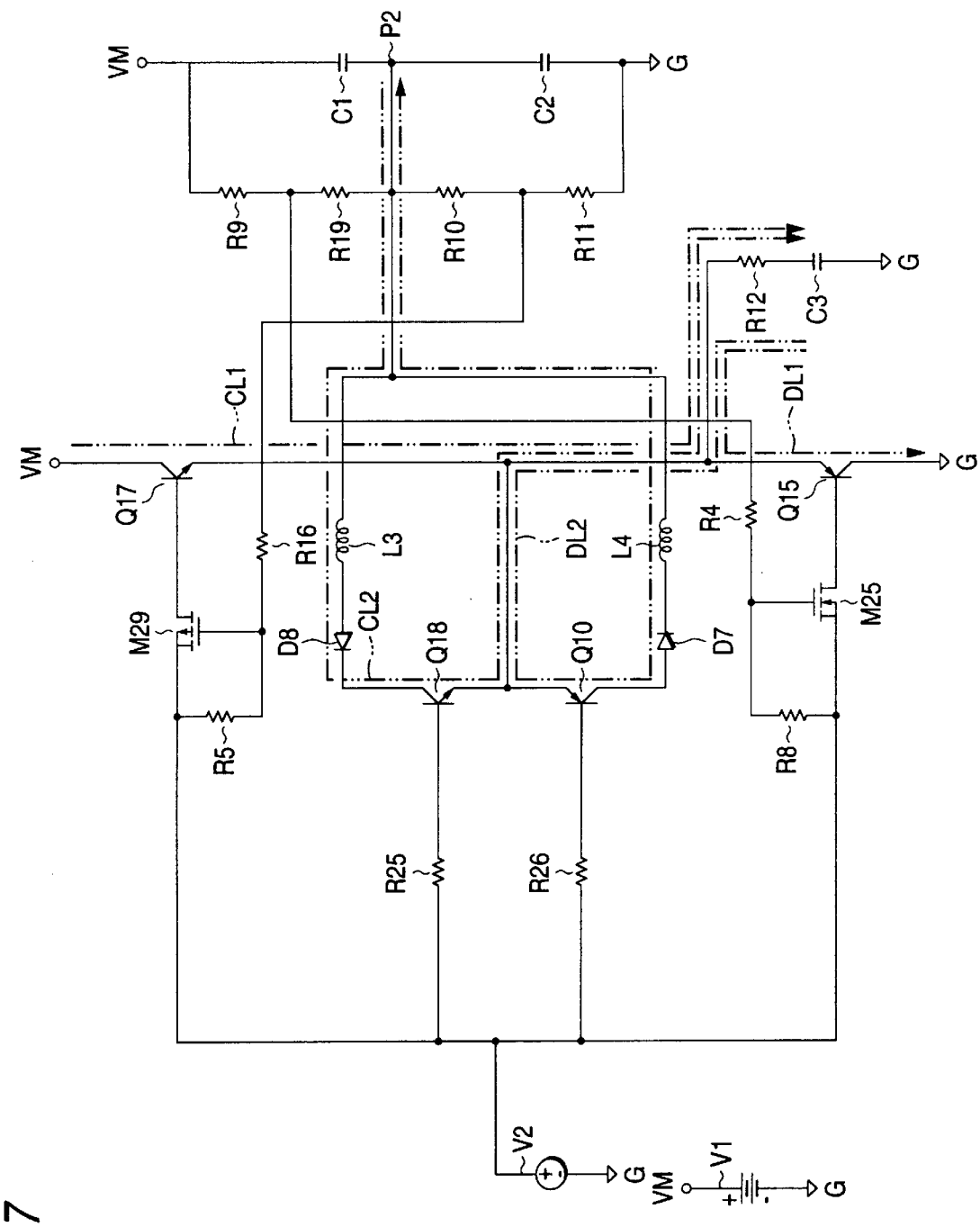
FIG. 7 shows a recording head driving circuit diagram in Modified Example of Embodiment 2 according to the present invention.

FIG. 7 is a diagram of the recording head driving circuit (a capacitive-load driving circuit) of a modified example of Embodiment 2. The basic configuration of the driving circuit in this example is similar to that of the driving circuit in Embodiment 2, therefore, like elements having corresponding functions are given like reference characters in FIG. 7 and the description thereof will be omitted.

As is shown in FIG. 7, inductor L3 is added in between the collector of transistor Q18 and P2, between the capacitors C1 and C2, in second charging path CL2, and inductor L4 is added in between the collector of transistor Q10 and P2, between capacitors C1 and C2, in second discharging path DL2. The rest of the configuration and operation is similar to the arrangement in Embodiment 2 described above, therefore the description thereof will be omitted.

In this modified example, like Modified Example 1 of Embodiment 1, the voltage applied to transistors Q10 and Q18 is held low and their "on" time is prolonged by using the counter electromotive force of inductors L3 and L4. This is advantageous because, not only is the quantity of heat generated by transistors Q10 and Q18 reduced, but also the load of the power supply is small since the charge stored in capacitors C1 and C2 is used effectively.

[Embodiment 3]

Figure 8:
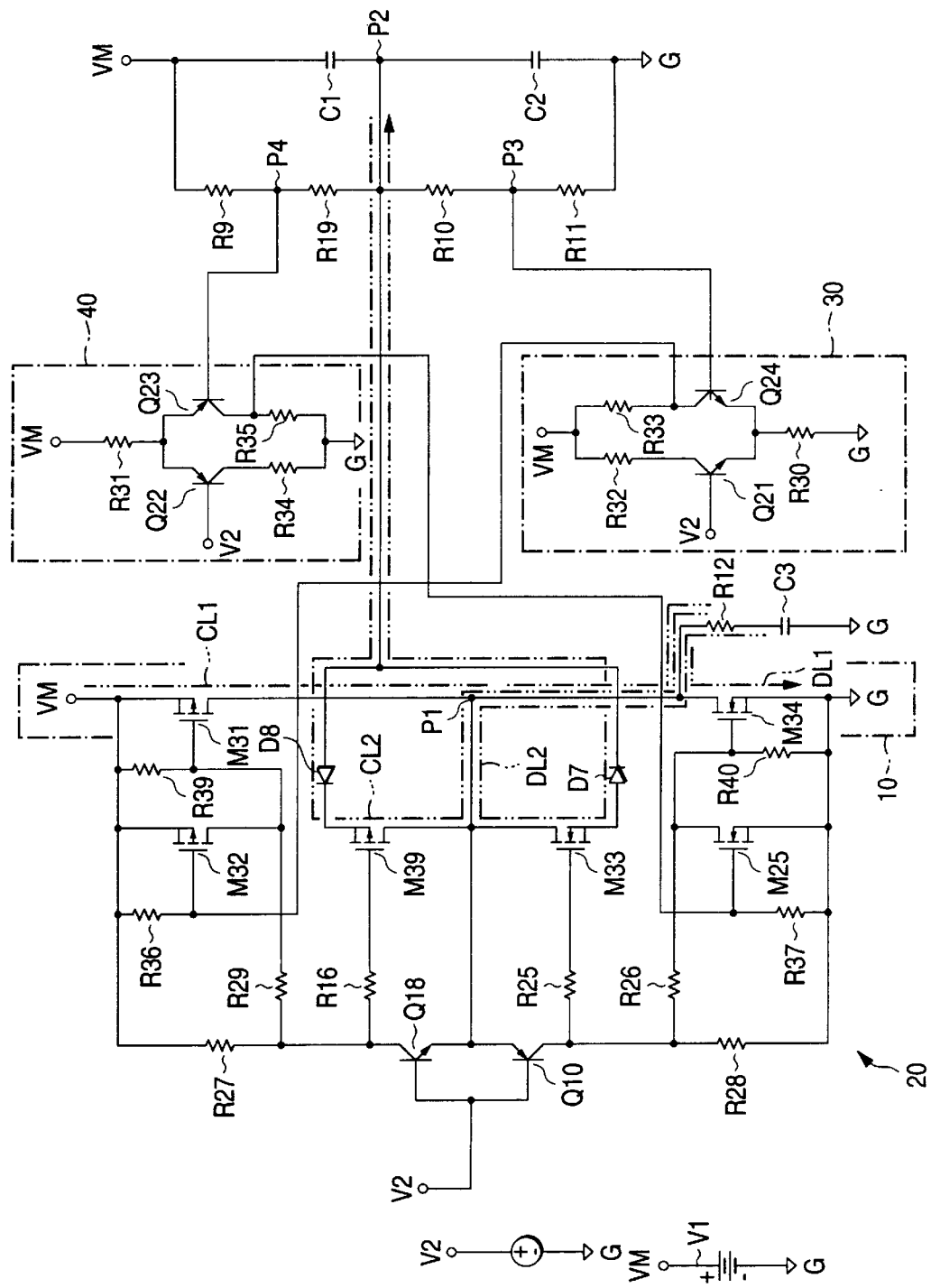
FIG. 8 shows a recording head driving circuit diagram in Embodiment 3 according to the present invention.

FIG. 8 is a diagram of the recording head driving circuit (a capacitive- load driving circuit) of Embodiment 3. The basic configuration and operation of this driving circuit are also similar to those of the driving circuit in each of preceding embodiments of the invention, therefore, like elements having corresponding functions are given like reference characters in FIG. 8.

In the driving circuit in Embodiment 3, as shown in FIG. 8, MOSFET M31 (the first switching element according to the present invention) is added in first charging path CL1 and when piezoelectric element C3 is charged, MOSFET M31 provides or stops the supply of charging current from the power supply to piezoelectric element C3, as will be more fully discussed below. Furthermore, MOSFET M34 (the third switching element according to the present invention) is added in first discharging path DL1 and when piezoelectric element C3 is discharged, provides or stops the supply of discharged current from piezoelectric element C3 to ground G, as will be more fully discussed below. A resistor R40 is connected across the gate_source of MOSFET M34.

In addition to these changes to current amplifier circuit 10, second charging path CL2 is formed for use in charging piezoelectric element C3 by capacitors C1 and C2 prior to charging piezoelectric element C3 via first charging path CL1. Second charging path CL2 is connected to P2, between capacitors C1 and C2 connected in series, between the power supply and ground G. Furthermore, divider resistors R9, R19, R10 and R11 and capacitors C1 and C2 are connected in parallel. In this case, capacitors C1 and C2 each have a capacitance sufficiently greater than that of the load (piezoelectric element C3), the value of which is equal to, for example, about 10 $\mu$F (about 10 times greater than the capacitance value of piezoelectric element C3 as a load).

MOSFET M39 (the second switching element according to the present invention) and diode D8, for cutting off reverse current from piezoelectric element C3 or the power supply to capacitors C1 and C2 after the charging piezoelectric element C3 via second charging path CL2 is terminated, are added in second charging path CL2. Resistor R16 is connected to the gate of MOSFET M39, which keeps second charging path CL2 closed only during the time piezoelectric element C3 is charged by capacitors C1 and C2 via second charging path CL2, and switches second charging path CL2 open during all other times as will be more fully discussed below.

Second discharging path DL2 is formed in the driving circuit in Embodiment 3 and is used for charging capacitors C1 and C2 with the charge discharged from piezoelectric element C3 prior to discharging piezoelectric element C3 via first discharging path DL1.

MOSFET M33 (the fourth switching element according to the present invention) and diode D7 are added in second discharging path DL2 and are used for cutting off reverse current from capacitors C1 and C2 to piezoelectric element C3 after the charging of piezoelectric element C3 via second discharging path DL2 is terminated. Resistor R15 is connected to the gate of MOSFET M33, which keeps second discharging path DL2 closed only during the time piezoelectric element C3 is discharged via second discharging path DL2 to capacitors C1 and C2, and switches second discharging path DL2 open during all other times as will be more fully discussed below.

In order to charge or discharge piezoelectric element C3 by selecting first and second charging paths CL1 and CL2 or first and second discharging paths DL1 and DL2, control circuit 20 in Embodiment 3 holds MOSFETs M34 and M33 "off" when piezoelectric element C3 is charged and sequentially switches MOSFETs M39 and then M31 "on" and holds MOSFETs M39 and M31 "off" when piezoelectric element C3 is discharged and sequentially switches MOSFETs M33 and then M34 "on".

MOSFET M32 is formed in control circuit 20 so that when the potential of input signal V2 reaches a predetermined level, or above, during the time input signal V2 rises, charging of piezoelectric element C3 via first charging path CL1 occurs by turning on MOSFET M31. An output from a differential amplifier circuit 30 with the potential at P3, between resistors R10 and R11, as a reference potential is supplied to the gate of MOSFET M32. Resistors R10 and R11 are connected as the divider resistors R of capacitors C1 and C2. Differential amplifier circuit 30 comprises a resistor R30, a transistor Q21, whose base is supplied with input signal V2, a resistor R32, a transistor Q24, whose base is supplied with the potential at P3, between resistors R10 and R11, and a resistor R33.

MOSFET M25 is formed in control circuit 20 so that when the potential of input signal V2 drops to a predetermined level, or below, during the time input signal V2 falls, discharging of piezoelectric element C3 via first discharging path DL1 to ground G occurs by turning on MOSFET M34. An output from a differential amplifier circuit 40 with the potential at P4, between resistors R9 and R19, as a reference potential is supplied to the gate of the MOSFET M32. Resistors R9 and R19 are connected as the divider resistors R of capacitors C1 and C2. Differential amplifier circuit 40 comprises a resistor R31, a transistor Q22, whose base is supplied with input signal V2, a resistor R34, a transistor Q23, whose base is supplied with the potential at P4, between resistors R9 and R19, and a resistor R35.

Control circuit 20 has transistors Q18 and Q10, whose bases are supplied with input signal V2, at the preceding stages of MOSFETs M39 and M33. The collectors of transistors Q18 and Q10 are each connected via resistors R16 and R25 to the gates of MOSFETs M39 and M33. The collectors of transistors Q18 and Q10 are also each connected to the power supply and ground G via resistors R27 and R28 and to the gates of MOSFETs M32 and M25 via resistors R36 and R37. The collectors of transistors Q18 and Q10 are also each connected via resistors R29 and R26 to the gates of MOSFETs M31 and M34.

MOSFETs M39 and M33 perform on-off operations by means of input signal V2 and are controlled through the on-off operations.

More specifically, transistor Q24 is held "on" because the gate potential of transistor Q24 is higher than the gate potential (the potential of input signal V2) of transistor Q21 in differential amplifier circuit 30 during a time interval corresponding to, and between, time T1 and time T2 in FIG. 2. MOSFET M32 is turned on as its gate potential is situated on the low potential side. Consequently, MOSFET M31 is held "off" as its gate potential is situated on the high potential side. Hence, charging of piezoelectric element C3 from the power supply via first charging path CL1 does not occur. When transistor Q18 starts to turn on, on the other hand, MOSFET M39 is held "on" as the gate potential of MOSFET M39 lowers. As a result, charging of piezoelectric element C3 by capacitors C1 and C2 via second charging path CL2 occurs. In the means time, MOSFET M31 is kept "off" as MOSFET M32 is also kept "on."

Charging piezoelectric element C3 via second charging path CL2 continues at time T2 until the high-to-low relationship between the potential (the base potential of transistor Q21) of input signal V2 and the potential (the base potential of transistor Q24) at P3, between resistors R10 and R11, is inverted. When inversion occurs, MOSFET M32 is turned off, as its gate potential is situated on the high potential side, and MOSFET M31 is turned on, as its gate potential is situated on the low potential side. Hence, charging of piezoelectric element C3 from the power supply via first charging path CL1 occurs. At this time, no current flows out of MOSFET M39 because its drain potential is low.

On the other hand, transistor Q23 is held "on" because the gate potential of transistor Q23 is higher than the gate potential (the potential of input signal V2) of transistor Q22 in differential amplifier circuit 40 during a time interval corresponding to, and between, time T4 and time T5 in FIG. 2. MOSFET M25 is turned on as its gate potential is situated on the low potential side. Consequently, MOSFET M34 is held "off", as its gate potential is situated on the high potential side. Hence, discharging of piezoelectric element C3 to ground G via first discharging path DL1 does not occur. On the other hand, when transistor Q10 starts to turn on, MOSFET M33 is held "on", as the gate potential of MOSFET M33 rises. As a result, discharging of piezoelectric element C3 to capacitors C1 and C2 via second discharging path DL2 occurs. In the mean time, MOSFET M34 is kept "off" as MOSFET M25 is also kept "on.

Discharging of piezoelectric element C3 via second discharging path DL2 continues at time T5 until the high-to-low relation between the potential (the base potential of transistor Q22) of input signal V2 and the potential (the base potential of transistor Q23) at P4, between resistors R9 and R19, is inverted. When inversion occurs, MOSFET M25 is turned off, as its gate potential is situated on the low potential side, and MOSFET M34 is turned on, as its gate potential is situated on the high potential side. Hence, discharging of piezoelectric element C3 via first discharging path DL1 to ground G occurs. At this time, no current flows out of the MOSFET M33 because its drain potential is high.

Even in the driving circuit in Embodiment 3, part of the charge discharged from piezoelectric element C3 is stored in capacitors C1 and C2. Moreover, piezoelectric element C3 is not charged totally by the power supply because the charge stored in capacitors C1 and C2 is also used for charging piezoelectric element C3. Consequently, power consumption, as seen from the power supply is low. As seen from MOSFET M31, the highest value of power supply voltage VM is not applied directly across the source drain, only a voltage equivalent to the difference between the terminal potential of piezoelectric element C3, after charging of piezoelectric element C3 occurs by capacitors C1 and C2, and the power supply potential, is applied. Accordingly, less heat is generated by MOSFET M31. This is also the case with MOSFET M34 because the highest value of driving voltage VM (the highest value of the terminal-to-terminal voltage of piezoelectric element C3) is not applied directly across the emitter collector, only a voltage equivalent to the difference between the terminal potential of piezoelectric element C3, after discharging the piezoelectric element C3 to capacitors C1 and C2 occurs, and the potential of ground G, is applied. Therefore, the same effect that is achieved in Embodiment 1 is also achieved in this case; for example, less heat is generated by MOSFET M34.

[Embodiment 4]

FIG. 9 is a diagram of the recording head driving circuit (a capacitive-load driving circuit) of Embodiment 4. The driving circuit in Embodiment 4 is configured to simultaneously possess the special features of Embodiments 1 and 2. The basic operation of each circuit unit of the driving circuit in Embodiment 4 is similar to those of the driving circuit units in Embodiments 1 and 2, therefore like elements having corresponding functions are given like reference characters in FIG. 9. However, a two-stage system of charging piezoelectric element C3 by means of capacitors C1 and C2 is formed in Embodiment 4, instead of a one-stage system of charging piezoelectric element C3 by means of capacitors C1 and C2 in Embodiments 1 and 2. Moreover, a two-stage system of discharging piezoelectric element C3 to capacitors C1 and C2 is formed in Embodiment 4, instead of a one-stage system of discharging piezoelectric element C3 to capacitors C1 and C2 in Embodiments 1 and 2.

More specifically, the driving circuit in Embodiment 4 is formed with a second charging path CL2' for low voltage use and for charging piezoelectric element C3 from P2, between capacitors C1 and C2, and a second charging path CL2" for high voltage use and for charging piezoelectric element C3 from P18, between capacitors C1 and C4, prior to charging piezoelectric element C3 via first charging path CL1, as shown in FIG. 9. At this point, capacitors C1, C2 and C4 each have a capacitance sufficiently greater than that of the load (piezoelectric element C3), the value of which is equal to, for example, about 10 $\mu$F (about 10 times greater than the capacitance value of piezoelectric element C3 as a load).

Furthermore, transistor Q21 is added in second charging path CL2', as in Embodiment 2, so that input signal V2 is supplied via resistor R34 to the base of transistor Q21. Moreover, a diode D9 for cutting off reverse current and an inductor L5 are added in second charging path CL2'. On the other hand, transistor Q18 is added in second charging path CL2", as in Embodiment 1, and diode D8 for cutting off reverse current and an inductor L6 are also added in second charging path CL2".

The driving circuit in Embodiment 4 is formed with a second discharging path DL2' for high voltage use and for discharging piezoelectric element C3 to P18, between capacitors C1 and C4, prior to discharging piezoelectric element C3 via first discharging path DL1, and a second discharging path DL2" for low voltage use and for discharging piezoelectric element C3 to P2, between capacitors C1 and C2.

In this case, transistor Q10 is added in second discharging path DL2', as in Embodiment 2, so that input signal V2 is supplied via resistor R26 to the base of transistor Q10. Moreover, diode D7 for cutting off reverse current and an inductor L8 are added in second discharging path DL2'. On the other hand, transistor Q22 is added in second discharging path DL2", as in Embodiment 1, and diode D8 for cutting off reverse current and an inductor L7 are also added in second discharging path DL2".

In order to charge or discharge piezoelectric element C3 by selecting first and second charging paths CL1, CL2' and CL2" or first and second discharging paths DL1, DL2' and DL2", control circuit 20 in Embodiment 4 holds transistors Q15, Q10 and Q22 "off" when piezoelectric element C3 is charged and sequentially switches transistors Q21, Q18 and then Q17 "on" and holds transistors Q21, Q18 and Q17 "off" when piezoelectric element C3 is discharged and sequentially switches transistors Q15, Q10 and then Q22 "on". The on-off operation of each switching element in this pattern is performed on the basis of the relative difference in level between the potential of input signal V2 and the terminal potential of capacitors C1, C2 and C4.

In Embodiment 4, the potential at respective points P9 and P10 among resistors R19, R28 and R9, as the divider resistors of capacitor C1, is supplied via resistors R16 and R4 to the gate of MOSFET M29 for controlling transistor Q17 and the gate of MOSFET M25 for controlling transistor Q15 accordingly. Furthermore, the potential at P3, between resistors R10 and R11, as the divider resistors of capacitor C2, is supplied via resistor R33 to the gate of MOSFET M38 for controlling transistor Q18. Moreover, the potential at P12, between resistors R29 and R30, as the divider resistors of the capacitor C4, is supplied via resistor R35 to the gate of MOSFET M36 for controlling transistor Q22. Consequently, control circuit 20 sequentially switches transistors Q18 and then Q21 "on", from low voltage use to high voltage use, though the two-stage second charging paths CL2' and CL2" formed in Embodiment 4. Control circuit 20 also sequentially switches transistors Q10 and then Q22 "on", from high voltage use to low voltage use, though the two-stage second discharging paths DL2', DL2" formed in Embodiment 4.

Since the charging discharging quantities between piezoelectric element C3 and capacitors C1, C2 and C4 are great in the driving circuit in Embodiment 4, power consumption as seen from the power supply is reduced. Moreover, the heat generated by each transistor is extremely low because the voltage applied at the time of charging is dispersed to transistors Q17, Q18 and Q21 and because the voltage applied at the time of discharging is dispersed to transistors Q10, Q22 and Q15.

In Embodiment 4, as in Modified Example 1 of Embodiment 1, the voltage applied to transistors Q10, Q18, Q22 and Q21 is held low and their "on" time is prolonged by using the counter electromotive force of inductors L8, L6, L7 and L5. As a result, it is advantageous because, not only is the quantity of heat generated by transistors Q10, Q18, Q22 and Q21 reduced, but the load of the power supply is small since the charge stored in capacitors C1, C2 and C4 is used effectively.

[Embodiment 5]

Figure 10:
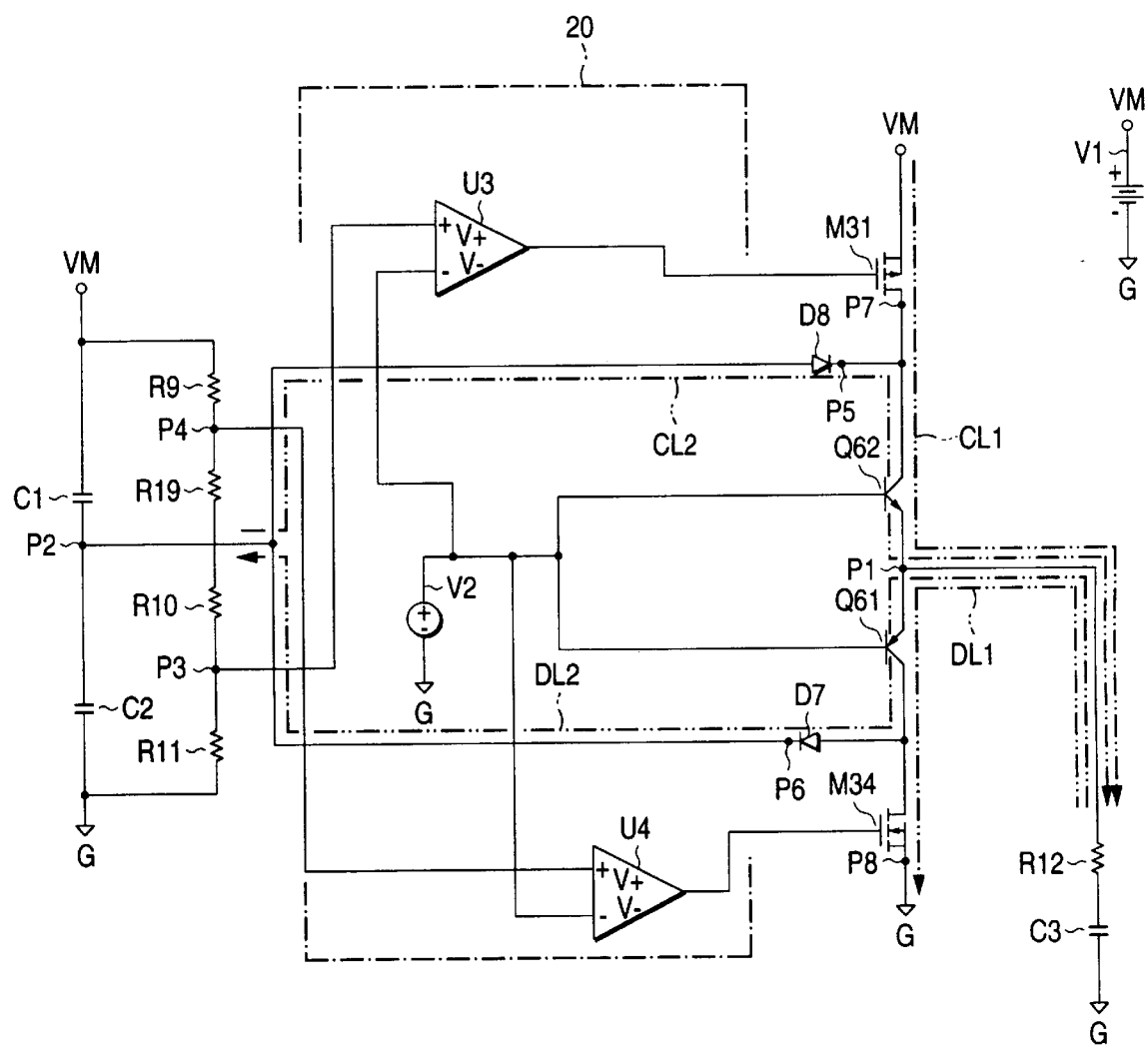
FIG. 10 shows a recording head driving circuit diagram in Embodiment 5 according to the present invention.

FIG. 10 is a diagram of the recording head driving circuit (a capacitive-load driving circuit) of Embodiment 5. In the driving circuit in Embodiment 5, piezoelectric element C3 can be charged by the power supply (the power supply potential VM) via MOSFET M31 (the first switching element according to the present invention) and resistor R12 in first charging path CL1 and piezoelectric element C3 can also be discharged to ground G via resistor R12 and MOS- FET M34 (the third switching element according to the present invention) in first discharging path DL1 as shown in FIG. 10.

The driving circuit in Embodiment 5 has a second charging path CL2 for charging piezoelectric element C3 from P2, between capacitors C1 and C2, prior to charging piezoelectric element C3 by the power supply, via first charging path CL1. Capacitors C1 and C2 and divider resistors R9, R19, R10 and R11 are connected in parallel. In this case, capacitors C1 and C2 each have a capacitance sufficiently greater than that of the load (piezoelectric element C3), the value of which is equal to, for example, about 10 $\mu$F (about 10 times greater than the capacitance value of piezoelectric element C3 as a load).

In Embodiment 5, a transistor Q62 (the second switching element according to the present invention) is put in a line common to first charging path CL1 and second charging path CL2 out of second charging path CL2. Furthermore, diode D8, for cutting off reverse current, is added in a line independent of first charging path CL1 out of second charging path CL2. Transistor Q62 is connected in series to MOSFET M31, as seen from first charging path CL1, and as will be more fully discussed below, is held "off" piezoelectric element C3 is discharged, whereas while piezoelectric element C3 is being charged, transistor Q62 is held "on" not only when piezoelectric element C3 is charged from P2, between capacitors C1 and C2, via second charging path CL2, but also from the power supply via first charging path CL1.

Furthermore, the driving circuit in Embodiment 5 is formed with second discharging path DL2 for charging capacitors C1 and C2 with the charge discharged from piezoelectric element C3 prior to discharging piezoelectric element C3 to ground G via first discharging path DL1.

In Embodiment 5, a transistor Q61 (the fourth switching element according to the present invention) is added in a line common to first discharging path DL1 and second discharging path DL2 out of second discharging path DL2. Furthermore, diode D7, for cutting off reverse current, is added in a line independent of first discharging path DL1 out of second discharging path DL2. Transistor Q61 is connected in series to MOSFET M34 as seen from first discharging path DL1, and as will be more fully discussed below, is held "off" when piezoelectric element C3 is charged, whereas while piezoelectric element C3 is being discharged, transistor Q61 is held "on" not only when piezoelectric element C3 is discharged from piezoelectric element C3 to capacitors C1 and C2 via second discharging path DL2, but also to ground G via first discharging path DL1.

In order to charge or discharge the piezoelectric element C3 by properly selecting first and second charging paths CL1 and CL2 or first and second discharging paths DL1 and DL2, control circuit 20 in Embodiment 5 holds transistor Q61 "off" when piezoelectric element C3 is charged and sequentially switches transistor Q62 and then MOSFET M31 "on" and holds transistor Q62 "off" when piezoelectric element C3 is discharged and sequentially switches transistor Q61 and then MOSFET M34 "on".

In control circuit 20, input signal V2 is applied to the base of transistor Q62 and during the time the base potential of transistor Q62 remains higher than the emitter potential thereof (during the charging time), transistor Q62 is held "on." Furthermore, transistor Q61 is held "off" when the base potential of transistor Q61 remains higher than the emitter potential thereof (during the charging time), since input signal V2 has also been applied to the base of transistor Q61. As the potential at P3, between resistors R10 and R11, as divider resistors with respect to capacitor C2, and input signal V2 have been input to a comparator U3 (a voltage comparator), MOSFET M31 is not turned on until input signal V2 becomes higher than a predetermined voltage (potential at P3) when transistor Q62 is turned on and thereafter. At this point, the resistance values of resistors R10 and R11 are 7 k$\Omega$ and 15 k$\Omega$, respectively, and a potential slightly lower than the potential at P2, between capacitors C1 and C2, is used as a comparative potential when MOSFET M31 performs the switching operation.

Furthermore, input signal V2 is applied to the base of transistor Q61 and when the base potential of transistor Q61 remains lower than the emitter potential thereof (during the discharging time), transistor Q61 is held "on." Still further, transistor Q62 is held "off" when the base potential of transistor Q62 remains lower than the emitter potential thereof (during the discharging time) since input signal V2 has been applied to the base of transistor Q62. As the potential at P4, between resistors R9 and R19, as divider resistors with respect to the capacitor C1, and the input signal V2 have been input to a comparator U4 (a voltage comparator), MOSFET M34 is not turned on until input signal V2 becomes lower than a predetermined voltage (potential at P4) when transistor Q61 is turned on and thereafter. At this point, the resistance values of resistors R9 and R19 are 15 k$\Omega$ and 7 k$\Omega$, respectively, and a potential slightly higher than the potential at P2, between capacitors C1 and C2, is used as a comparative potential when MOSFET M34 performs the switching operation.

Figure 11:
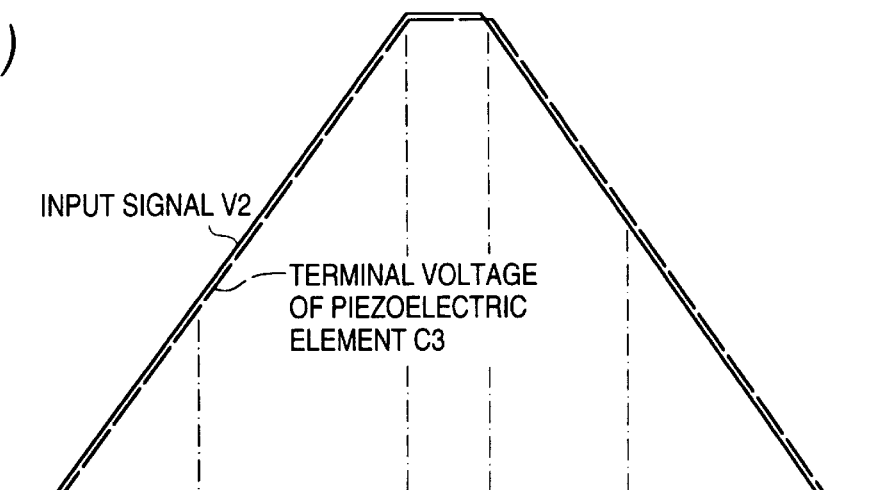
FIG. 11(A) shows a waveform chart of an input signal to a recording head driving circuit of FIG. 10 and what illustrates terminal-to-terminal voltage variation in a piezo-electric element therein.
FIG. 11(B) shows a waveform chart illustrating current variation at each point of the recording head driving circuit therein.
Figure 11:
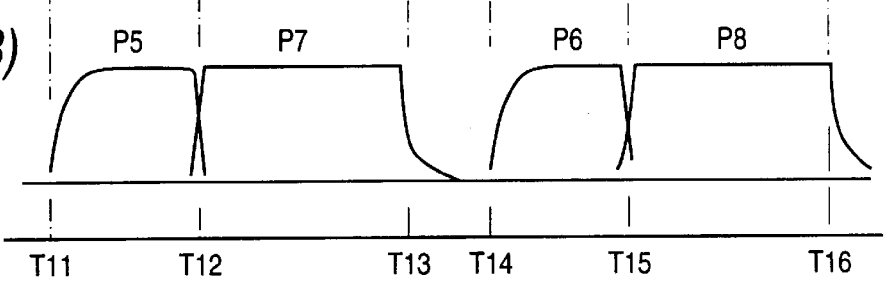

FIG. 11(A) shows the potential variation of input signal V2 and the terminal potential variation (measured values at P1) of piezoelectric element C3 in the driving circuit. FIG. 11(B) shows the measured results of the current flowing through second charging path CL2 at P5, the measured results of the current flowing through first charging path CL1 at P7, the measured results of the current flowing through second discharging path DL2 at P6 and the measured results of the current flowing through first discharging path DL1 at P8.

As shown in FIG. 11(A), input signal V2 is in the form of a trapezoidal-wavelike voltage pulse, including a linear rise time (time interval between time T11 and time T13), a flat peak level time (time interval between time T13 and time T14) and a linear decay time (time interval between time T14 and time T16), the input signal V2 being reduced to an ink-jet head driving voltage pulse.

First, capacitors C1 and C2 are in a charged state and piezoelectric element C3 is in a discharged state at time T11. At this point, input signal V2 is applied to the base of transistor Q62 and when the base potential of transistor Q62 becomes higher than the emitter potential thereof, as input signal V2 rises, transistor Q62 is turned on. Although input signal V2 has also been applied to the base of transistor Q61, transistor Q61 is held "off" since the base potential of transistor Q61 is higher than the emitter potential thereof. Although the potential at P3, between resistors R10 and R11, as divider resistors with respect to the capacitor C2, and input signal V2 have been input to the comparator U3, MOSFET M31 is held "off" since input signal V2 is lower than the predetermined voltage (the potential at P3) at the initial charging stage. During a time interval between time T11 and time T12 as shown in FIG. 11(B), the charging current from P2, between capacitors C1 and C2, flows into piezoelectric element C3 after passing through transistor Q62 via second charging path CL2 accordingly. In the meantime, piezoelectric element C3 is not charged by the power supply via first charging path CL1 because MOSFET M31 is held "off."

Charging piezoelectric element C3 like this is carried out until input signal V2 becomes higher than the predetermined voltage (the potential at P3). When input signal V2 becomes higher than the predetermined voltage (the potential at P3) at time T12, the output of comparator U3 causes MOSFET M31 to turn on and charging of piezoelectric element C3 starts by the power supply via first charging path CL1. At this point, the current from the power supply is cut off by diode D8 in second charging path CL2.

When input signal V2 becomes flat at time T13, charging of piezoelectric element C3 by the power supply via first charging path CL1 stops.

Subsequently, discharging of piezoelectric element C3 starts when input signal V2 falls at time T14. In other words, transistor Q61 is turned on when the base potential of transistor Q61 becomes lower than the emitter potential thereof at time T14. Although input signal V2 is also applied to the base of transistor Q62, transistor Q62 is held "off," because the base potential of transistor Q62 is lower than the emitter potential thereof at this point of time. Although the potential at P4, between resistors R9 and R19, as divider resistors with respect to capacitor C1, and input signal V2 have been input to comparator U4, MOSFET M34 is held "off" since the input signal V2 is higher than the predetermined voltage at the initial discharging stage. Accordingly, during a time interval between time T14 and time T15, as shown in FIG. 11(B), the discharging current from piezoelectric element C3 flows to P2, between capacitors C1 and C2, after passing through transistor Q61 via second discharging path DL2. In the meantime, discharging of piezoelectric element C3 to ground G via the first discharging path DL1 does not occur because MOSFET M34 is held "off."

Discharging piezoelectric element C3 like this occurs until input signal V2 becomes lower than the predetermined voltage (the potential at P4, between resistors R9 and R19, as divider resistors with respect to capacitor C1). When input signal V2 becomes lower than the predetermined voltage (the potential at P4) at time T15, the output of comparator U4 causes MOSFET M34 to be turned on and discharging of piezoelectric element C3 to ground G via first discharging path DL1 starts. At this time, the current from capacitors C1 and C2 is cut off by diode D7 in second discharging path DL2 and no current flows to ground G.

When input signal V2 becomes flat at time T16, discharging of piezoelectric element C3 to ground G via first discharging path DL1 stops.

In the driving circuit of Embodiment 5, part of the charge discharge from piezoelectric element C3 is stored in capacitors C1 and C2, instead of totally discharging piezoelectric element C3 to ground G. Moreover, piezoelectric element C3 is not charged totally by the power supply because the charge stored in capacitors C1 and C2 is also used for charging piezoelectric element C3. Therefore, part of the quantity of electricity necessary for charging piezoelectric element C3 is supplied from capacitors C1 and C2 and the rest of the power is supplied from the power supply. Consequently, power consumption as seen from the power supply is low. Moreover, the highest value of power supply voltage VM or the terminal-to-terminal voltage of piezoelectric element C3 is not applied directly to transistors Q62 and Q61. Accordingly, less heat is generated by transistors Q62 and Q61. Incidentally, the outputs of comparators U3 and U4 change sharply and no heat is generated from MOSFETs M31 and M34 because MOSFETs M31 and M34 are turned either completely "off" (resistance is substantially 0 V) or completely "on" (resistance is substantially infinitely high).

[Embodiment 6]

Figure 12:
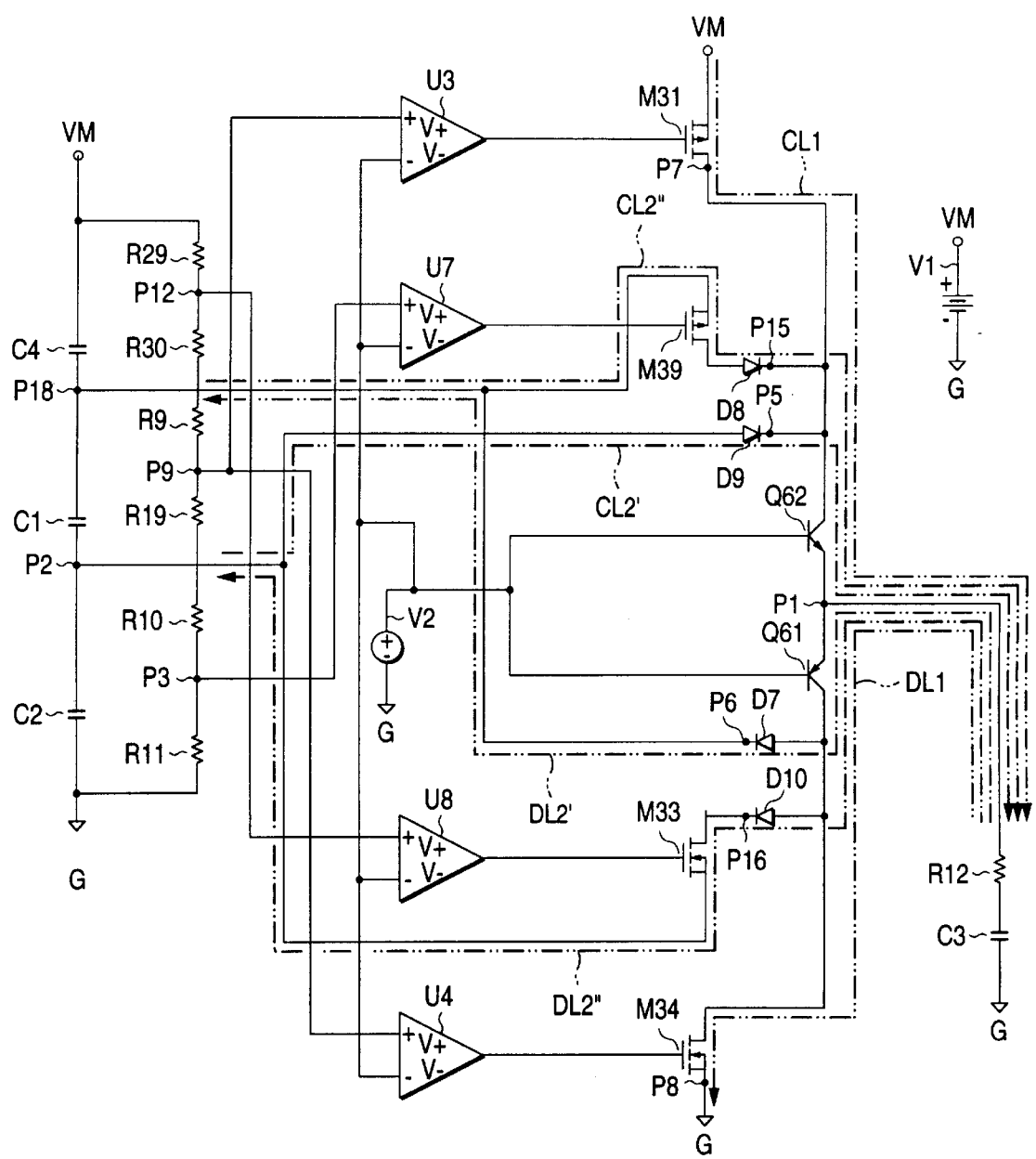
FIG. 12 shows a recording head driving circuit diagram in Embodiment 6 according to the present invention.

FIG. 12 is a diagram of the recording head driving circuit (a capacitive-load driving circuit) of Embodiment 6. In the driving circuit in Embodiment 6, piezoelectric element C3 can be charged by the power supply (power supply potential VM) via MOSFET M31 (the first switching element according to the present invention) and resistor R12 in first charging path CL1 and piezoelectric element C3 can also be discharged to ground G via resistor R12 and MOSFET M34 (the third switching element according to the present invention) in first discharging path DL1 as shown in FIG. 12.

The driving circuit of Embodiment 6 has a second charging path CL2' for low voltage use and for charging piezoelectric element C3 from P2, between capacitors C1 and C2, and a second charging path CL2" for high voltage use and for charging piezoelectric element C3 from P8, between capacitors C1 and C4, prior to charging piezoelectric element C3 via first charging path CL1. Furthermore, the driving circuit of Embodiment 6 is formed with a second discharging path DL2' for high voltage use and for discharging piezoelectric element C3 to P18, between capacitors C4 and C1, prior to discharging piezoelectric element C3 via first discharging path DL1 to ground G and a second discharging path DL2" for low voltage use and for discharging piezoelectric element C3 to P2, between capacitors C1 and C2. In this case, capacitors C1, C2 and C4 each have a capacitance sufficiently greater than that of the load (piezoelectric element C3), the value of which is equal to, for example, about 10 μF (about 10 times greater than the capacitance value of piezoelectric element C3 as a load).

In Embodiment 6, transistor Q62 (the second switching element according to the present invention) is added in a line common to second charging path CL2" for high voltage use and first charging path CL1 out of second charging path CL2' for low voltage use. Diode D9, for cutting off reverse current, is added in a line independent of first charging path CL1 out of second charging path CL2' for low voltage use. Furthermore, MOSFET M39 (the second switching element according to the present invention) and diode D8, for cutting off reverse current, are added in the line independent of second charging path CL2' for low voltage use and first charging path CL1 out of second charging path CL2" for high voltage use.

Transistor Q62 is connected in series to MOSFET M31, as seen from first charging path CL1, and as will be more fully discussed hereinafter, is held "off" when piezoelectric element C3 is discharged, whereas while piezoelectric element C3 is being charged, transistor Q62 is held "on", not only when piezoelectric element C3 is charged from P2, between capacitors C1 and C2, via second charging path CL2' for low voltage use, but also when piezoelectric element C3 is charged from P18, between capacitors C4 and C1, via second charging path CL2" for high voltage use and by power supply via first charging path CL1.

In Embodiment 6, transistor Q61 (the fourth switching element according to the present invention) is added in a line common to second discharging path DL2" for low voltage use and first discharging path DL1 out of second discharging path DL2' for high voltage use. Diode D7, for cutting off reverse current, is added in a line independent of second discharging path DL2" for high voltage use and first discharging path DL1 out of second discharging path DL2' for high voltage use. Furthermore, MOSFET M33 (the fourth switching element according to the present invention) and diode D10, for cutting off reverse current, are added in a line independent of second discharging path DL2' for low voltage use and first discharging path DL1 out of second discharging path DL2" for high voltage use.

Transistor Q61 is connected in series to MOSFET M34, as seen from the first discharging path DL1, and as will be more fully discussed below, is held "off" when time piezoelectric element C3 is discharged, whereas while piezoelectric element C3 is being discharged, transistor Q61 is held "on", not only when piezoelectric element C3 is discharged via the second discharging path DL2' for high voltage use to P18, between capacitors C4 and C1, but also when piezoelectric element C3 is discharged to ground G via first discharging path DL1.

In order to charge or discharge piezoelectric element C3 by properly selecting first and second charging paths CL1, CL2' and CL2" or first and second discharging paths DL1, DL2' and DL2", control circuit 20 in Embodiment 6 holds transistor Q61 "off" when piezoelectric element C3 is charged and sequentially switches transistor Q62, MOSFET M39 and then MOSFET M31 "on" state and holds Q62 "off" when piezoelectric element C3 is discharged and sequentially switches transistor Q61, MOSFET M33 and then MOSFET M34 "on".

In this control circuit, input signal V2 is applied to the base of transistor Q62 and when the base potential of transistor Q62 remains higher than the emitter potential thereof (during the charging time), transistor Q62 is held "on." Furthermore, transistor Q61 is held "off" when the base potential of transistor Q61 remains higher than the emitter potential thereof (during the charging time) since input signal V2 is also applied to the base of transistor Q61.

As the potential at P3, between the resistors R10 and R11, as divider resistors with respect to capacitor C2, and input signal V2 have been input to a comparator U7 (a voltage comparator), MOSFET M39 is not turned on until input signal V2 becomes higher than the predetermined voltage (potential at the P3), when transistor Q62 is turned on and thereafter. Furthermore, as the potential at P9, between resistors R9 and R19, as divider resistors with respect to capacitor C1, and input signal V2 have been input to comparator U3, MOSFET M31 is not turned on until input signal V2 becomes higher than a predetermined voltage (potential at the joint P9), when transistor Q62 and MOSFET M39 are turned on and thereafter. At this point, a potential slightly lower than the potential at P2, between capacitors C1 and C2, is used as a comparative potential when MOSFET M39 performs the switching operation in accordance with the resistance ratio between resistors R10 and R11. A potential slightly lower than the potential at P18, between capacitors C4 and C1, is used as a comparative potential when MOSFET M31 performs the switching operation in accordance with the resistance ratio between resistors R9 and R19.

Transistor Q61 is held "on" when the base potential of transistor Q61 remains lower than the emitter potential thereof (during the discharging time). At this point, transistor Q62 is held "off" when the base potential of transistor Q62 remains lower than the emitter potential thereof (during the discharging time) since input signal V2 has also been applied to the base of transistor Q62. Furthermore, MOSFET M33 is not turned on until input signal V2 becomes lower than the predetermined potential (the potential at P12), when transistor Q61 is turned on and thereafter, since the potential at P12, between resistors R29 and R30, as divider resistors with respect to capacitor C4, and input signal V2 have been input to comparator U8 (a voltage comparator).

Moreover, MOSFET M34 is not turned on until input signal V2 becomes lower than the predetermined potential (the potential at P9) when transistor Q61 and MOSFET M33 are turned on, and thereafter, since the potential at P9, between resistors R9 and R19, as divider resistors with respect to capacitor C1, and input signal V2 have been input to comparator U4. At this point, a potential slightly higher than the potential at P18, between capacitors C4 and C1, is used as a comparative potential when MOSFET M33 performs the switching operation in accordance with the resistance ratio between resistors R29 and R30. Furthermore, a potential slightly higher than the potential at P2, between capacitors C1 and C2, is used as a comparative potential when MOSFET M31 performs the switching operation in accordance with the resistance ratio between resistors R9 and R19.

Figure 13:
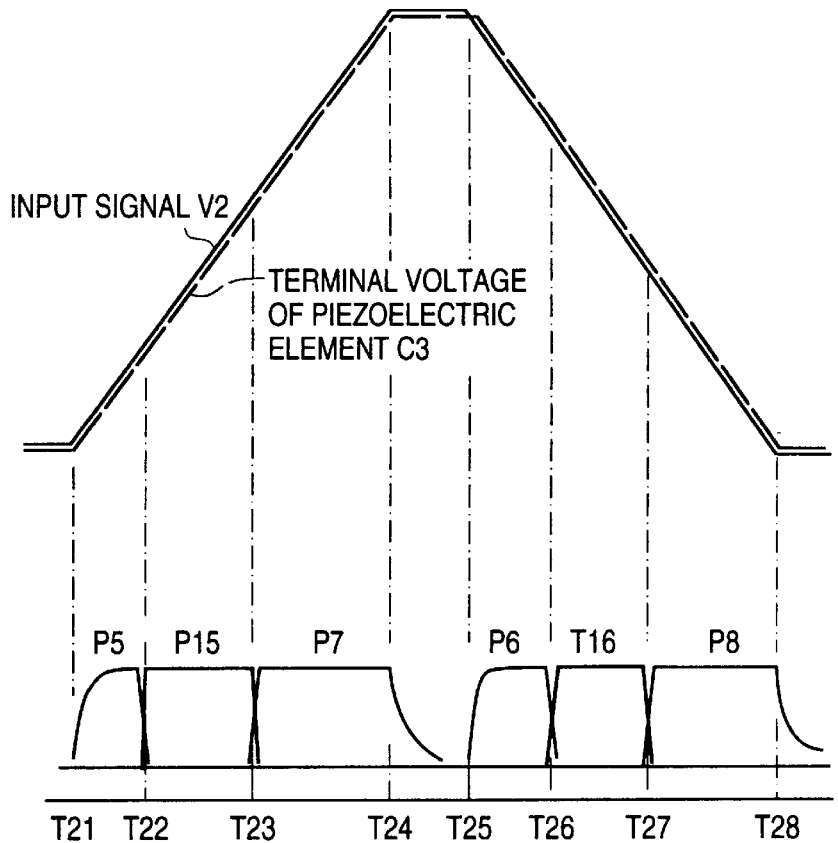
FIG. 13(A) shows a waveform chart of an input signal to a recording head driving circuit of FIG. 12 and what illustrates terminal-to-terminal voltage variation in a piezo-electric element therein.
FIG. 13(B) shows a waveform chart illustrating current variation at each point of the recording head driving circuit therein.

FIG. 13(A) shows the potential variation of input signal V2 and the terminal potential variation (measured values at the joint P1) of piezoelectric element C3 in this driving circuit. FIG. 13(B) shows the measured results of the current flowing through second charging path CL2' for low voltage use at P5, the measured results of the current flowing through second charging path CL2" for high voltage use at P15, the measured results of the current flowing through first charging path CL1 at P7, the measured results of the current flowing through second charging path DL2' for high voltage use at P6, the measured results of the current flowing through second discharging path DL2" for low voltage use at P16 and the measured results of the current flowing through first discharging path DL1 at P8.

As shown in FIG. 13(A), input signal V2 is in the form of a trapezoidal-wavelike voltage pulse including a linear rise time (time interval between time T21 and time T24), a flat peak level time (time interval between time T24 and time T25) and a linear decay time (time interval between time T25 and time T28), input signal V2 being reduced to an ink-jet head driving voltage pulse.

First, capacitors C1 and C2 are in a charged state and piezoelectric element C3 is in a discharged state at time T21. At this point, input signal V2 is applied to the base of transistor Q62 and when the base potential of transistor Q62 becomes higher than the emitter potential thereof, transistor Q62 is turned on. Although input signal V2 has also been applied to the base of transistor Q61, transistor Q61 is held "off" since the base potential of transistor Q61 is higher than the emitter potential thereof. Although the potential at P3, between resistors R10 and R11, as divider resistors with respect to the capacitor C2, and input signal V2 have been input to comparator U7, MOSFET M39 is held "off" since input signal V2 is lower than the predetermined voltage (the potential at the joint P3) at the initial charging stage. Although the potential at P9, between resistors R9 and R19, as divider resistors with respect to the capacitor C1, and input signal V2 have also been applied to comparator U3, MOSFET M31 is held "off" since input signal V2 is lower than the predetermined voltage (the potential at the joint P9) at the initial charging stage.

During a time interval between time T21 and time T22 as shown in FIG. 13(B), the charging current from P2, between capacitors C1 and C2, flows into piezoelectric element C3 after passing through transistor Q62 via second charging path CL2' accordingly. In the meantime, piezoelectric element C3 is not charged from P18, between capacitors C4 and C1, via second charging path CL2" for high voltage use because MOSFET M39 is held "off." Piezoelectric element C3 is also not charged by the power supply via first charging path CL1 because MOSFET M31 is held "off."

Charging piezoelectric element C3 like this occurs until input signal V2 becomes higher than the predetermined voltage (the potential at P3, between resistors R10 and R11, as divider resistors with respect to the capacitor C2). When input signal V2 becomes higher than the predetermined voltage (the potential at P3) at time T22, the output of comparator U7 causes MOSFET M39 to be turned on and charging of piezoelectric element C3 from P18, between capacitors C4 and C1, via second charging path CL2" for high voltage use starts. At this point, the current from P18, between capacitors C4 and C1, is cut off by diode D9 in second charging path CL2' for low voltage use and never flows into second charging path CL2' for low voltage use.

Charging piezoelectric element C3 like this occurs until input signal V2 becomes equal to or higher than the predetermined voltage (the potential at P9, between resistors R9 and R19, as divider resistors with respect to capacitor C1). When input signal V2 becomes equal to or higher than the predetermined voltage (the potential at P9) at time T23, the output of comparator U3 causes MOSFET M31 to turn on and charging of piezoelectric element C3 by the power supply via first charging path CL1 starts. At this point, the current from the power supply never flows into second charging path CL2' for low voltage use and second charging path CL2" for high voltage use since the charging current is cut off by diodes D9 and D8 each added in second charging path CL2' for low voltage use and second charging path CL2" for high voltage use.

When input signal V2 becomes flat at time T24, charging of piezoelectric element C3 by the power supply via first charging path CL1 stops.

Discharging of piezoelectric element C3 starts from the state described above when input signal V2 falls at time T25. In other words, transistor Q61 is turned on when the base potential of transistor Q61 becomes lower than the emitter potential thereof at time T25. Although input signal V2 has also been applied to the base of transistor Q62, transistor Q62 is held "off" since the base potential of transistor Q62 is lower than the emitter potential thereof. Although the potential at P12, between resistors R29 and R30, as divider resistors with respect to capacitor C4, and input signal V2 have been input to comparator U8, MOSFET M33 is held "off" since input signal V2 is higher than the predetermined voltage (the potential at P12) at the initial discharging stage. Although the potential at P9, between resistors R9 and R19, as divider resistors with respect to capacitor C1, and input signal V2 have also been input to comparator U4, MOSFET M34 is held "off" since input signal V2 is higher than the predetermined voltage (the potential at P9) at the initial discharging stage.

Accordingly, during a time interval between time T25 and time T26 as shown in FIG. 13(B), the discharging current from piezoelectric element C3 flows to P8, between the capacitors C4 and C1, after passing through transistor Q61 via second discharging path DL2'. In the meantime, discharging of piezoelectric element C3 to P2, between capacitors C1 and C2, via second discharging path DL2" for low voltage use does not occur because MOSFET M33 is held "off." Discharging of piezoelectric element C3 to ground G via first discharging path DL1 also does not occur because MOSFET M34 is held "off."

Discharging of piezoelectric element C3 like this occurs until input signal V2 becomes equal to or lower than the predetermined voltage (the potential at P12, between resistors R29 and R30, as divider resistors with respect to the capacitor C4). When input signal V2 becomes lower than the predetermined voltage (the potential at P12) at time T26, the output of comparator U8 causes MOSFET M33 to be turned on and discharging of piezoelectric element C3 to P2, between capacitors C1 and C2, via second discharging path DL2" for low voltage use starts. At this point, the charge stored in capacitors C4 and C1 is cut off by diode D7, added in second discharging path DL2' for high voltage use, and capacitors C4 and C1 are not discharged.

Discharging of piezoelectric element C3 like this occurs until input signal V2 becomes equal to or lower than the predetermined voltage (the potential at P9, between resistors R9 and R19, as divider resistors with respect to the capacitor C1). When input signal V2 becomes lower than the predetermined voltage (the potential at P9) at time T27, the output of comparator U4 causes MOSFET M34 to turn on and discharging of piezoelectric element C3 to ground G via first discharging path DL1 starts. At this point, the charge stored in capacitors C4, C1 and C2 is cut off by diodes D7 and D10, each added in second discharging path DL2' for high voltage use and the second discharging path DL2" for low voltage use, and the charge never flows to ground G.

When input signal V2 becomes flat at time T28, discharging of piezoelectric element C3 to ground G via first discharging path DL1 stops.

In the driving circuit of Embodiment 6, instead of completely discharging the charge from piezoelectric element C3 to ground G, as in the conventional circuit, most of the charge is used for charging piezoelectric element C3, whereby the power consumption as seen from the power supply is reduced further. Also, because power supply voltage VM and the highest value of the terminal-to-terminal voltage of piezoelectric element C3 are not applied directly to transistors Q62 and Q61, less heat is generated by transistors Q62 and Q61. Since the time required for the current to flow through transistors Q62 and Q61 is shorter than what is required in the case of Embodiment 5, the reduction of heat being generated by transistors Q62 and Q61 is noticeable.

As set forth above, in the capacitive-load driving circuit and the recording head driving circuit according to the present invention, the charge discharged from the capacitive load, such as a piezoelectric element, is stored in capacitors and is used for charging the capacitive load, therefore the capacitive load is not charged totally by the power supply. In other words, part of the charge necessary for charging the capacitive load is supplied from the capacitors and the rest of the charge is supplied from the power supply. Hence, power consumption as seen from the power supply is low. Moreover, seen from the switching element, the power supply voltage is not applied directly but only the terminal potential of the capacitive load charged by the capacitors or discharged is applied. Hence, less heat is generated by the switching element. A further advantage is that a small package can be used because the generation of heat from each switching element is reduced to the extent of an increase in the number of switching elements.

What is claimed is:

1. A capacitive-load driving circuit for repeatedly charging and discharging a capacitive load according to an input signal, comprising:
   a first switching element which is in a first charging path for use in electrical charging from a power supply to the capacitive load;
   a second switching element which is in a second charging path for use in electrical charging from capacitors to the capacitive load;
   a third switching element which is in a first discharging path for use in electrical discharging from the capacitive load to ground;
   a fourth switching element which is in a second discharging path for use in electrical discharging from the capacitive load to the capacitors; and a control circuit for holding the third and fourth switching elements "off" when charging the capacitive load and sequentially switching the second switching element and then the first switching element "on" and for holding the first and second switching elements "off" when discharging the capacitive load and sequentially switching the fourth switching element and then the third switching element "on".

2. A capacitive-load driving circuit as claimed in claim 1, further comprising:
   a charging path as the second charging path with the second switching element which is in the charging path in a line independent of the first charging path, and
   a discharging path as the second discharging path with the fourth switching element which is in the discharging path in a line independent of the first discharging path.

3. A capacitive-load driving circuit as claimed in claim 2, wherein the second charging path and the second discharging path are each arranged in a plurality of lines and
   wherein the control circuit sequentially switches the second switching elements, which are each in the plurality of second charging paths, "on", from low voltage use to high voltage use, when charging the capacitive load and sequentially switches the second switching elements, which are each in the plurality of second discharging paths, "on", from high voltage use to low voltage use, when discharging the capacitive load.

4. A capacitive-load driving circuit as claimed in claim 1, further comprising:
   a charging path as the second charging path with the second switching element which is in the charging path in a line common to the first charging path so that the second switching element and the first switching element are connected in series and
   a discharging path as the second discharging path with the fourth switching element which is in the discharging path in the line common to the first discharging path so that the fourth switching element and the third switching element are connected in series; wherein
   the control circuit switches the first switching element "on" while holding the second switching element "on" after switching the second switching element "on" when charging the capacitive load, and switches the third switching element "on" while holding the fourth switching element "on" after switching the fourth switching element "on" when discharging the capacitive load.

5. A capacitive-load driving circuit as claimed in claim 1, further comprising:
   a second charging path for low voltage use as the second charging path with the second switching element which is in the charging path in a line common to the first charging path so that the second switching element and the first switching element are connected in series;
   a second charging path for high voltage use with the second switching element which is in the charging path in a line independent of the first charging path;
   a second discharging path for low voltage use as the second discharging path with the fourth switching element which is in the discharging path in the line common to the first discharging path so that the fourth switching element and the third switching element are connected in series; and
   a second discharging path for high voltage use with the fourth switching element which is in the discharging path in the line independent of the first discharging path; wherein
   the control circuit sequentially switches the second switching element and then the first switching element of the second charging path for high voltage use "on" while holding the second switching element "on" after switching the second switching element of the second charging path for low voltage "on" when charging the capacitive load, and sequentially switches the fourth switching element and then the third switching element of the second discharging path for high voltage use "on" while holding the fourth switching element "on" after switching the fourth switching element of the second discharging path for low voltage use "on" when discharging the capacitive load.

6. A capacitive-load driving circuit as claimed in one of claims 1–5, wherein the control circuit controls the on-off state of the first, second, third and fourth switching elements on the basis of the relative difference in level between the potential of the input signal and the terminal potential of the capacitors.

7. A capacitive-load driving circuit as claimed in claim 6, wherein the control circuit includes a differential amplifier circuit for comparing the relative level of the potential of the input signal with that of the terminal potential of the capacitors and controls the on-off state of the first, second, third and fourth switching elements on the basis of the output of the differential amplifier circuit.

8. A capacitive-load driving circuit as claimed in claim 6, wherein the control circuit includes a voltage comparator for comparing the relative level of the potential of the input signal with that of the terminal potential of the capacitors and controls the on-off state of one of the first, second, third and fourth switching elements on the basis of the output of the voltage comparator.

9. A capacitive-load driving circuit as claimed in one of claims 1–5, wherein an inductor is in both the second charging path and the second discharging path.

10. A capacitive-load driving circuit as claimed in one of claims 1–5, wherein a diode for cutting off reverse current from the capacitive load to the capacitors is in the second charging path and wherein a diode for cutting off reverse current from the capacitors to the capacitive load is in the second discharging path.

11. A capacitive-load driving circuit as claimed in one of claims 1–5, wherein the control circuit includes a first MOSFET connected to a control terminal of the second switching element and a second MOSFET connected to a control terminal of the fourth switching element.

12. A capacitive-load driving circuit as claimed in claim 11, wherein the control circuit includes Zener diodes each connected across a gate_source of the first MOSFET and that of the second MOSFET.

13. A recording head driving circuit comprising:
   a capacitive-load driving circuit for repeatedly charging and discharging a capacitive load according to an input signal, comprising:
     a first switching element which is in a first charging path for use in electrical charging from a power supply to the capacitive load;
     a second switching element which is in a second charging path for use in electrical charging from capacitors to the capacitive load;
     a third switching element which is in a first discharging path for use in electrical discharging from the capacitive load to ground;

a fourth switching element which is in a second discharging path for use in electrical discharging from the capacitive load to the capacitors;

a control circuit for holding the third and fourth switching elements "off" when charging the capacitive load and sequentially switching the second switching element and then the first switching element "on" and for holding the first and second switching elements "off" when discharging the capacitive load and sequentially switching the fourth switching element and then the third switching element "on";

and a piezoelectric element as the capacitive load in an ink-jet nozzle, wherein the control circuit is used for controlling the on-off operations of the first, second, third and forth switching elements with a trapezoidal-wavelike pulse voltage output from a trapezoidal-wave voltage generating circuit as the input signal.

14. A recording head driving circuit as claimed in claim 13 wherein said capacitive-load driving circuit further comprises:

a charging path as the second charging path with the second switching element which is in the charging path in a line independent of the first charging path, and a discharging path as the second discharging path with the fourth switching element which is in the discharging path in a line independent of the first discharging path.

15. A recording head driving circuit as claimed in claim 14, wherein the second charging path and the second discharging path are each arranged in a plurality of lines and wherein the control circuit sequentially switches the second switching elements, which are each in the plurality of second charging paths, "on", from low voltage use to high voltage use, when charging the capacitive load and sequentially switches the second switching elements, which are each in the plurality of second discharging paths, on", from high voltage use to low voltage use, when discharging the capacitive load.

16. A recording head driving circuit as claimed in claim 13 wherein said capacitive-load driving circuit further comprises:

a charging path as the second charging path with the second switching element which is in the charging path in a line common to the first charging path so that the second switching element and the first switching element are connected in series and a discharging path as the second discharging path with the fourth switching element which is in the discharging path in the line common to the first discharging path so that the fourth switching element and the third switching element are connected in series; wherein the control circuit switches the first switching element "on" while holding the second switching element "on" after switching the second switching element "on" when charging the capacitive load, and switches the third switching element "on" while holding the fourth switching element "on"after switching the fourth switching element "on" when discharging the capacitive load.

17. A recording head driving circuit as claimed in claim 13 wherein said capacitive-load driving circuit further comprises:

a second charging path for low voltage use as the second charging path with the second switching element which is in the charging path in a line common to the first charging path so that the second switching element and the first switching element are connected in series;

a second charging path for high voltage use with the second switching element which is in the charging path in a line independent of the first charging path;

a second discharging path for low voltage use as the second discharging path with the fourth switching element which is in the discharging path in the line common to the first discharging path so that the fourth switching element and the third switching element are connected in series; and a second discharging path for high voltage use with the fourth switching element which is in the discharging path in the line independent of the first discharging path; wherein the control circuit sequentially switches the second switching element and then the first switching element of the second charging path for high voltage use "on" while holding the second switching element on after switching the second switching element of the second charging path for low voltage "on" when charging the capacitive load, and sequentially switches the fourth switching element and then the third switching element of the second discharging path for high voltage use "on" while holding the fourth switching element "on" after switching the fourth switching element of the second discharging path for low voltage use "on" when discharging the capacitive load.

* * * * *